(12) United States Patent
Hirabayashi

(10) Patent No.: US 6,373,544 B1
(45) Date of Patent: Apr. 16, 2002

(54) ELECTRO-OPTICAL DEVICE SUBSTRATE, ELECTRO-OPTICAL DEVICE, ELECTRONIC DEVICE, AND PROJECTION DISPLAY DEVICE

(75) Inventor: Yukiya Hirabayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/097,157

(22) Filed: Jun. 12, 1998

(30) Foreign Application Priority Data

Jun. 17, 1997 (JP) .............................. 9-159699
Mar. 2, 1998 (JP) ........................... 10-049722

(51) Int. Cl.[7] ..................... G02F 1/1345; G02F 1/1339; G02F 1/1333
(52) U.S. Cl. ..................... 349/149; 349/153; 349/138
(58) Field of Search .................. 349/149, 153, 349/155, 138; 257/59, 72

(56) References Cited

U.S. PATENT DOCUMENTS

| | | | |
|---|---|---|---|
| 5,563,727 A | 10/1996 | Larson et al. .................. | 359/54 |
| 5,652,667 A | 7/1997 | Kurogane .................... | 349/42 |
| 5,744,820 A | * 4/1998 | Matsushima et al. ....... | 349/149 |

FOREIGN PATENT DOCUMENTS

| | | |
|---|---|---|
| EP | 0 740 188 A2 | 10/1996 |
| EP | 0 763 765 A1 | 3/1997 |
| EP | 0 768 561 A2 | 4/1997 |
| JP | A-8-304819 | 11/1996 |

* cited by examiner

Primary Examiner—William L. Sikes
Assistant Examiner—Tarifur R. Chowdhury
(74) Attorney, Agent, or Firm—Oliff & Berridge, PLC

(57) ABSTRACT

In a liquid crystal panel substrate having a layered film structure of interlayer insulation films and metal layers alternately formed on a semiconductor substrate provided with a transistor region for pixel selection thereon, to provide a configuration for achieving a uniform polishing rate without thickening of the interlayer insulation film to be polished. A liquid crystal panel substrate is provided with a shading film 12 composed of a second metal layer in a pixel region, a second interlayer insulation film 11 under the shading film, a wiring film 10 composed of a first metal layer under the second interlayer insulation film, a pixel electrode composed of a third metal layer on a third interlayer insulation film 13 on the shading film, and a connecting plug 15 connecting the wiring film 10 and the pixel electrode through an opening provided in the shading film 12. A lower dummy pattern A composed of the first metal layer and an upper dummy pattern B composed of the second metal layer are formed on the periphery of input terminal pads 26 in the non-pixel region. Since the surface level of the third interlayer insulation film 13 formed on the dummy patterns A and B is raised, excessive polishing is prevented at the position. As a result, a uniform polishing rate is achieved in CMP treatment.

27 Claims, 27 Drawing Sheets

FIG. 9
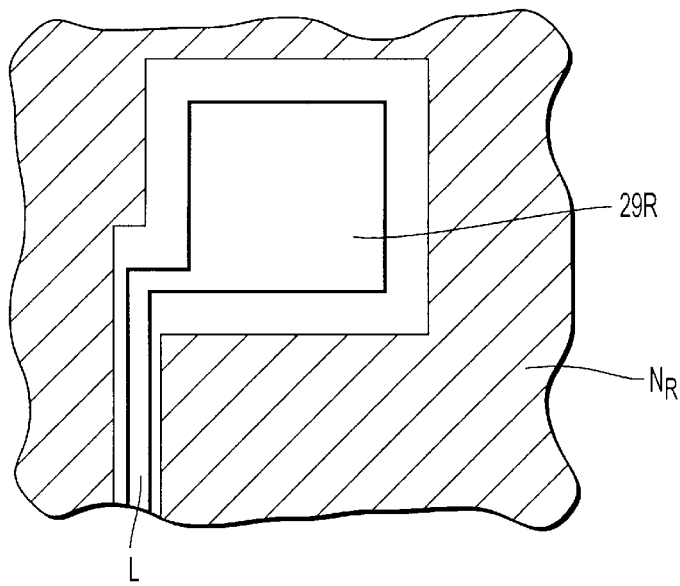
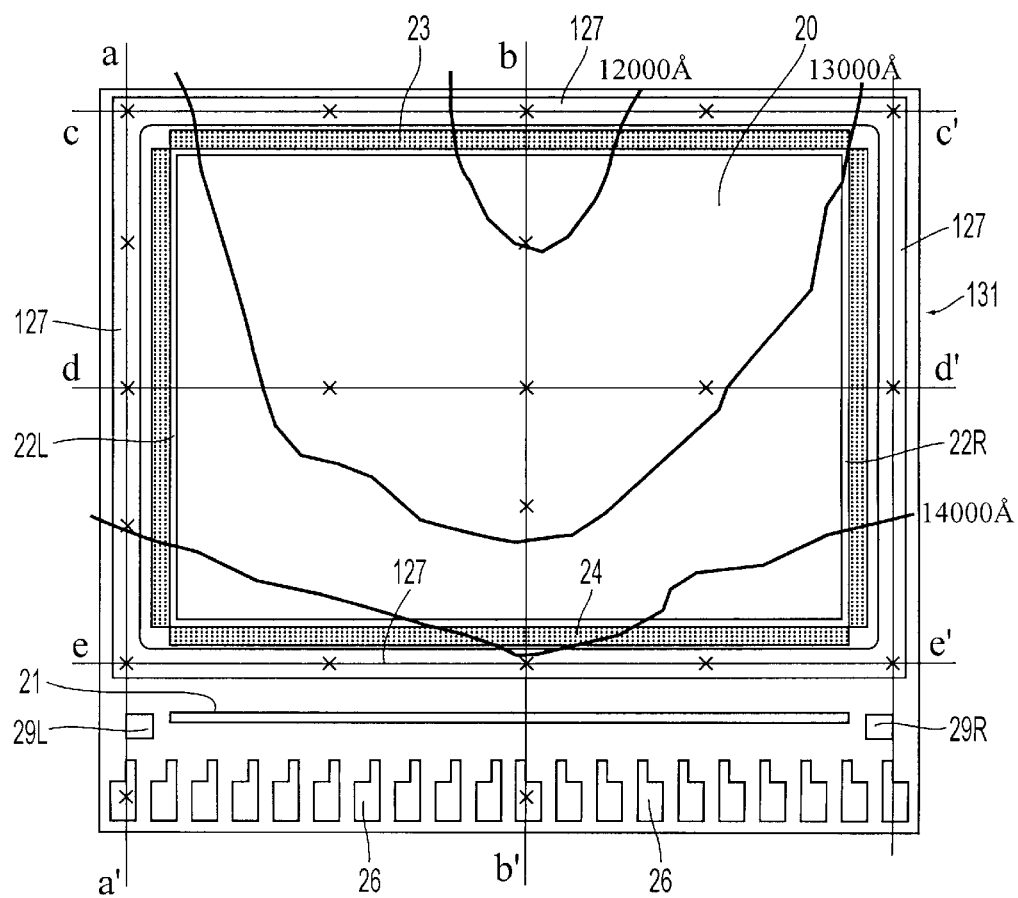
× POINT FOR MEASURING INTERLAYER FILM THICKNESS PROVIDED WITH A DUMMY PATTERN
FIG. 10

× POINT FOR MEASURING INTERLAYER FILM THICKNESS

× POINT FOR MEASURING INTERLAYER FILM THICKNESS

× POINT FOR MEASURING INTERLAYER FILM THICKNESS

ELECTRO-OPTICAL DEVICE SUBSTRATE, ELECTRO-OPTICAL DEVICE, ELECTRONIC DEVICE, AND PROJECTION DISPLAY DEVICE

BACKGROUND OF THE INVENTION

1. Field of Invention

The present invention relates to substrates for electro-optical devices such as a reflective liquid crystal panel substrate, and particularly relates to an electro-optical device substrate comprising a pixel region formed on an element region for selecting a pixel.

2. Description of Related Art

The present applicant disclosed configurations of a liquid crystal panel substrate, a liquid crystal panel and a projection display device in Japanese Patent Application No. 8-279388 filed on Oct. 22, 1996, as described below. The projection display device (liquid crystal projector) using a reflective liquid crystal panel as a light valve includes, as shown in FIG. 17, a light source 110 arranged along the system optical axis $L_0$; a polarized light illumination unit 100 including an integrator lens 120 and a polarized light converter 130; a polarized light beam splitter 200 for reflecting the S-polarized light beam emitted from the polarized light illumination unit 100 by an S-polarized light reflecting face 201; a dichroic mirror 412 for separating the blue light component (B) from the light reflected by the S-polarized light reflecting face 201 of the polarized light beam splitter 200; a reflective liquid crystal light valve 300B for modulating the separated blue light component (B); a dichroic mirror 413 for separating by reflection the red light component (R) from the light beams after separation of the blue light by a dichroic mirror 412; a reflective liquid crystal light valve 300R for modulating the separated red light component (R); a reflective liquid crystal light valve 300G for modulating the residual green light component (G) passing through the dichroic mirror 413; a projection optical system 500 including a projection lens for projecting synthesized light onto a screen 600, in which the light components modulated in the three reflective liquid crystal light valves 300R, 300G and 300B are synthesized by the dichroic mirrors 413 and 412 and the polarized light beam splitter 200 in their reverse paths. Reflective liquid crystal panel 30 shown in FIG. 18 as a cross-sectional view are used as the reflective liquid crystal light valves 300R, 300G and 300B.

The reflective liquid crystal panel 30 includes a reflective liquid crystal panel substrate 31 fixed with an adhesive on a supporting substrate 32 composed of glass or ceramic; a glass substrate 35 which is provided with a counter electrode (common electrode) 33 composed of a transparent conductive (ITO) film, and which lies at the incident light side, and is opposed with a gap to the reflective liquid crystal panel substrate 31 enclosed by a frame composed of a sealing agent 36; and a known twisted nematic (TN) liquid crystal or a super homeotropic (SH) liquid crystal 37 in which liquid crystal molecules are vertically aligned in a no-applied voltage state, the liquid crystal being sealed in the space enclosed by the sealing agent 36 between the reflective liquid crystal panel substrate 31 and the glass substrate 35.

FIG. 19 is a plan view of an enlarged layout of a reflective liquid crystal panel substrate 31 used in the reflective liquid crystal panel 30. The reflective liquid crystal panel substrate 31 includes a rectangular pixel region (display region) 20 provided with pixel electrodes disposed in matrix 14 shown in FIG. 18; gate line driver circuits (Y drivers) 22R and 22L lying at the exteriors of the right and left sides of the pixel region 20 for scanning gate lines (scanning electrodes or line electrodes); a precharging/testing circuit 23 lying at the exteriors of the upper side of the pixel electrode 14 for data lines (signal electrodes or column electrodes); an image signal sampling circuit 24 lying at the exterior of the bottom side of the pixel electrodes 14 for supplying image signals to the data lines in response to the image data; a sealing region 27 with a frame shape lying at the exterior of the gate line drivers 22R and 22L, the precharging/testing circuit 23 and the image signal sampling circuit 24, for placing a sealing agent 36; a plurality of terminal pads 26 arranged along the bottom end and connected to a flexible tape wiring 39 with an anisotropic conductive film (ACF) 38 therebetween; a data line driver circuit (X driver) 21 lying between the terminal pad array 26 and the sealing region 27 for supplying image signals to data lines in response to the image data; and relay terminal pads (so-called silver points) 29R and 29L lying beside both ends of the data line driver circuit 21 for energizing the counter electrode 33 on the glass substrate 35.

The peripheral circuits (the gate line driver circuits 22R and 22L, the precharging/testing circuit 23 and the image signal sampling circuit 24) lying at the interior of the sealing region 27 have a shading film 25 (refer to FIG. 18) to shield from the incident light, which is the same as the pixel electrodes 14 of the topmost layer.

FIG. 20 is an enlarged partial plan view of the pixel region 20 of the reflective liquid crystal panel substrate 31, and FIG. 21 is a cross-sectional view taken along the line A–A' of FIG. 20. In FIG. 21, numeral 1 represents a single-crystal silicon $P^-$ semiconductor substrate (an $N^-$ semiconductor substrate is also available) having a side of 20 mm. Numeral 2 represents a P-type well region formed on the top surface (main face) in the device-forming region (MOSFET etc.) of the semiconductor substrate 1, and numeral 3 represents a field oxide film (so-called LOCOS) which is formed for separating devices in the non-element-forming region of the semiconductor substrate 1. The p-type well region 2 shown in FIG. 21 is formed as a common well region for the pixel region 20 provided with a matrix of pixels having dimensions of, for example, 768×1024, and it is separated from a P-type well region 2' (refer to FIG. 22) for fabricating the devices of the peripheral circuits (the gate line driver circuits 22R and 22L, the precharging/testing circuit 23, the image signal sampling circuit 24 and the data line driver 21).

The field oxide film 3 is provided with two openings in the divided region of each pixel. A gate electrode 4a composed of polycrystalline silicon or a metal silicide is formed via a gate insulating film 4b in the center of one opening; an $N^+$ source region 5a, and an $N^+$ drain region 5b formed an the P-type well region 2 at the both sides of the gate electrode 4a form a N-channel MOSFET (insulated-gate field effect transistor) for pixel selection together with the gate electrode 4a. Gate electrodes 4a in a plurality of pixels arrayed in a line extend in the scanning line direction (the line direction of the pixels) to form gate lines 4.

A P-type capacitor electrode region 8, which is common to the line direction, is formed on the P-type well region 2 in the other opening; a capacitor electrode 9a composed of polycrystalline silicon or a metal silicide formed on the P-type capacitor electrode region 8 with an insulating film (dielectric film) 9b therebetween forms a retention capacitor C for retaining a signal selected by the MOSFET for pixel selection together with the P-type capacitor electrode region 8.

A first interlayer insulation film 6 is formed on the gate electrode 4a and the capacitor electrode 9a, and a first metal layer composed mainly of aluminum is formed on the insulating film 6.

The first metal layer includes a data line 7 (refer to FIG. 20) extending in the column direction, a source electrode wiring 7a, which protrudes from the data line 7 in a comb shape and is brought into conductive contact with a source region 5a through a contact hole 6a, and a relay wiring 10 which is brought into conductive contact with the drain region 5b through a contact hole 6b and with the capacitor electrode 9a through a contact hole 6c.

A second interlayer insulation film 11 is formed on the first metal layer which forms the data line 7, the source electrode wiring 7a, and the relay wiring 10, and a second metal layer essentially consisted of aluminum is formed on the second interlayer insulation film 11. The second metal layer includes a shading film 12 to cover the entire pixel region 20. The second metal layer as the shading film 12 forms a wiring 12b (refer to FIG. 22) for connecting the devices in the peripheral circuits (the gate line driver circuits 22R and 22L, the precharging/testing circuit 23, the image signal sampling circuit 24 and the data line driver circuit 21) formed on the periphery of the pixel region 20.

A plug hole 12a is provided at a position of the shading film 12 corresponding to the relay wiring 10. A third interlayer insulation film 13 is formed on the shading film 12, and a rectangular pixel electrode 14 which substantially corresponds to one pixel is formed as a reflective electrode on the interlayer insulation film 13. A contact hole 16 is formed through the third and second interlayer insulation films 13 and 11 so that it is located inside the opening 12a. After the contact hole 16 is filled with a high-melting-point metal such as tungsten by a CVD process, the high-melting-point metal layer formed on the third interlayer insulation film 13 and the front face of the interlayer insulation film 13 are flattened to form a mirror surface by a chemomechanical polishing (CMP) process. Next, an aluminum layer is formed by a low temperature sputtering process and a rectangular pixel electrode 14 with a side of 15 μm to 20 μm is formed by a patterning process. The relay wiring 10 and the pixel electrode 14 are electrically connected by a pillar connecting plug (interlayer conductive section) 15. A passivating film 17 is formed on the entire pixel electrode 14.

Alternatively, the connecting plug 15 may be formed by planarizing the third interlayer insulation film 13 by a CMP process, providing a contact hole and burying a high-melting-point metal such as tungsten.

The planarization of the third interlayer insulation film 13 by the CMP process is essential for depositing a pixel electrode 14 with a mirror surface as a reflective electrode on each pixel. The process is also essential for the formation of a dielectric mirror film on the pixel electrode 14 with a protective film therebetween. The CMP process uses a slurry (polishing liquid) composed of components which simultaneously prompt chemical etching and mechanical polishing of a wafer before scribing.

In the pixel region 20, however, the MOSFET for pixel selection, the electrode wirings 7a and 10 of the retention capacitor C and the shading film 12 are formed as underlying layers. Also, as shown in FIG. 22, in the peripheral circuit region (the gate line driver circuits 22R and 22L, the precharging/testing circuit 23, the image signal sampling circuit 24 and the data line driver circuit 21), the electrode wirings 7a and the wiring 12b between the devices are formed as underlying layers. Further, in the region of the terminal pad 26, a lower layer film 26a composed of the first metal layer and an upper layer film 26b composed of the second metal layer are formed. As a result, immediately after the deposition of the third interlayer insulation film 13, the surface level 13a represented by a broken line in FIG. 22 rises up at the pixel region, the peripheral circuit region and the terminal pad region. When polishing the surface of the third interlayer insulation film 13 having such large unevenness by the CMP process, the finished level 13b after polishing represented by the solid line in FIG. 22 reflects the original surface level 13a represented by the broken line. According to intensive investigations by the present inventor, it is clarified that the surface planarization of the third interlayer insulation film 13 on the pixel region is particularly important in the liquid crystal panel substrate 31 subjected to such polishing treatment.

Japanese Unexamined Patent Publication No. 9-68718 discloses a technology for planarization of the third interlayer insulation film 13 on the pixel region 20, in which discrete dummy patterns of the metal layer for individual pixels are provided between the first metal layer, such as the relay wiring 10, and the second metal layer (shading layer) to raise the level in order to suppress the entire surface unevenness of the shading film 12. When the intermediate metal layer is formed only for raising the level for each pixel, an additional step for depositing an interlayer insulation film should be incorporated. When the surface unevenness of the interlayer insulation film is reduced before polishing, the initial polishing rate in the CMP treatment unintentionally decreases, and thus planarization of the interlayer insulation film 13 to form a mirror surface requires a long polishing time and a large amount of polishing liquid. The deposition of dummy patterns on individual pixels in the pixel region 20 therefore has a disadvantage in the production process, resulting in increased production costs.

FIG. 23 is a contour plot of film illustrating the thickness distribution of the third interlayer insulation film 13 after polishing of the liquid crystal panel substrate 31, in which the third interlayer insulation film 13 with a thickness of approximately 24,000 Å is formed and then subjected to the CMP treatment until the residual thickness of the third interlayer insulation film 13 reaches approximately 12,000 Å in the center of the pixel region 20. In FIG. 24, a graph depicted by marks x shows the residual thickness distribution of the left seal in the vertical direction taken along line a–a' of FIG. 23. In FIG. 25, a graph depicted by marks x shows the residual thickness distribution of the central pixel in the vertical direction taken along line b–b' of FIG. 23. In FIG. 26, a graph depicted by marks x shows the residual thickness distribution of the upper seal in the transverse direction taken along line c–c' of FIG. 23. In FIG. 27, a graph depicted by marks x shows the residual thickness distribution of the central pixel in the transverse direction taken along line d–d' of FIG. 23. In FIG. 28, a graph depicted by marks x shows the residual thickness distribution of the lower sealing region in the transverse direction taken along line e–e' of FIG. 23.

As shown in FIGS. 23 to 28, the maximum difference in the thickness is approximately 6,120 Å in the pixel region 20 and the sealing region 27, hence the substrate including the pixel region 20 and sealing region 27 as a whole is not sufficiently flattened. The periphery of the terminal pad 26 and the upper and lower centers of the sealing regions 27 are excessively polished, whereas the right and left centers of the sealing region 27 are insufficiently polished.

As shown in FIG. 22, since the protruding terminal pads 26 in spot shape are discretely arranged as an array in the terminal pad region, the protruding sections 13c covered with the third interlayer insulation film 13 will be rapidly polished. The region of the terminal pad 26 therefore has a higher initial polishing rate than that of the pixel region 20. Accordingly, the region of the terminal pad 26 may be excessively polished to expose the underlying layer (upper layer film 26b) before the pixel region 20 is sufficiently flattened.

A means for compensating for the excessive polishing of the terminal pad 26 includes thick deposition of the third interlayer insulation film 13. According to this method, even if the region of the terminal pad 26 is rapidly polished, planarization of the third interlayer insulation film 13 is almost completed in this region before the underlying layer is exposed, hence the polishing rate significantly decreases compared with the initial polishing rate. As a result, the pixel region 20 can be flattened by spending an increased polishing time without exposing the underlying layer.

The formation of the thick third interlayer insulation film 13 causes an increased depth of the contact hole for the connecting plug 15, and it is difficult to embed the contact hole 16 with the high-melting-point metal which constitutes the connecting plug 15 as a result of such a high aspect ratio. The contact hole 16 originally has a large depth because the connecting plug 15 is a conductive section skipping an interlayer, which is formed through the second interlayer insulation film 11, the shading layer 12 and the third interlayer insulation film 13, and reaches the pixel electrode 14. Further, the opening 12a and thus the diameter of the contact hole 16 must be reduced in order to prevent leakage of the light entering from the gap between the pixel electrodes 14 to the devices such as MOSFET and the like through the opening 12a. The contact hole 16 inevitably has a high aspect ratio. Thinning of the interlayer insulation film 13 to be polished is therefore required. As described above, however, the CMP process excessively polishes the third interlayer insulation film 13 in the region of the terminal pad 26.

Since the thickness of the upper and lower centers of the sealing region 27 is smaller than that of the pixel region because of excessive polishing in the region of the terminal pad 26, the upper and lower edges of the pixel region 20 and the upper and lower center of the sealing region 27 are excessively polished, as shown in FIG. 26 and 28. The four corners of the sealing region 27 at the right and left sides will have also small thicknesses because of the excessive polishing of the region of the terminal pad 26, whereas the right and left centers of the sealing region 27 are hardly polished because of a low initial polishing rate caused by the flatness of the sealing region 27 before polishing. As a result, the right and left sides of the sealing region 27 and the right and left edges of the pixel region 20 are insufficiently polished in their central portions. When the peripheral edges of the pixel region 20 and the sealing region 27 have such tilted faces, the reflectance of the pixel electrode 14 formed on the third interlayer insulation film 13 after polishing decreases, the cell gap is adjusted with difficulty in the liquid crystal assembly, and the sealing agent has unsatisfactory adhesiveness. When the contact hole 16 for the connecting plug 15 is provided after the CMP treatment, it is difficult to optimize the etching time for the contact hole because of the uneven thickness.

SUMMARY OF THE INVENTION

In view of the incompatible problems regarding the interlayer insulation film formed between the shading film and the pixel electrode and requiring the polishing treatment in the reflective liquid crystal panel substrate, a first object of the present invention is to provide an electro-optical device substrate, such as a liquid crystal panel substrate, comprising a layered film structure of a plurality of interlayer insulation films and a plurality of conductive layers alternately formed in a pixel region formed on a substrate, wherein the electro-optical substrate has a structure requiring no additional deposition step and having a uniform polishing rate for the interlayer insulation film without thickening of the interlayer insulation film.

A second object of the present invention is to provide an electro-optical device substrate, such as a liquid crystal panel substrate, which has a flattened polished surface of the interlayer insulation film in the sealing region as well as in the pixel region, an improved reflectance of the pixel electrode, and which permits ready adjustment of the cell gap, improved adhesiveness of the sealing agent, and an optimized etching time of the contact hole.

In a first means in the present invention for achieving the first object, in order to flatten the surface level of the unpolished interlayer insulation film as uniformly as possible, a dummy pattern for raising the level of an interlayer insulation film to be polished is formed on the entire exterior of the pixel region by using the previously formed wiring layer, instead of on the space in the pixel region. That is, the present invention is characterized by an electro-optical device substrate comprising a layered film structure of a plurality of interlayer insulation films and a plurality of conductive layers alternately formed in a pixel region, in which a switching element is arranged on the substrate in response to each pixel, at least one interlayer insulation film below the top conductive layer among the plurality of conductive layers being flattened by polishing; the substrate being characterized in that a dummy pattern with a single or a plurality of layers comprising the conductive layers below said interlayer insulation film subjected to the polishing is provided near at least a terminal pad formed at a non-pixel region on the substrate. The terminal pad includes an input terminal pad arranged near the edge of the substrate and a relay terminal pad provided at the inner position of the substrate.

Since the surface level of the formed interlayer insulation film to be polished is raised near the terminal pad in such a configuration of the dummy pattern provided near the terminal pad, the surface level is substantially the same as the surface level of the interlayer insulation film to be polished in the pixel region, and thus the surface level is made uniform over the entire surface. The uniform surface has a uniform polishing rate in chemomechanical polishing (CMP) or the like without prompted polishing near and outside the terminal pad region and the polished surface of the interlayer insulation film is more flattened than conventional surfaces. As a result, the pixel region is more satisfactorily flattened, control of the cell gap is improved in cell assembly using a counter substrate, and the etching time for the contact holes of the interlayer conductive portion etc., in the pixel region after polishing is easily determined.

Such a uniform polished surface prevents exposition of the underlying terminal pad layer due to excessive polishing at the terminal pad portion, and can achieve thinning of the unpolished interlayer insulation film. Since the aspect ratio of the contact hole at the interlayer conductive portion in the pixel electrode is improved by the thinning, an opening portion with a small diameter is achieved by a contact hole with a small diameter. As a result, shading characteristics are improved.

The interlayer conductive portion electrically connects the first conductive layer connecting to the switching element and the upper conductive layer formed on the interlayer insulation film to be polished, and the dummy pattern may be any one of a first dummy pattern composed of the first conductive layer, a second dummy pattern composed of the second conductive layer which is formed between the first conductive layer and the upper conductive layer such as the shielding film, and a composite thereof.

When a conductive dummy pattern lies near the terminal pads outside the pixel region, the dummy pattern functions as a shading film, hence it prevents the invasion of stray light from the exterior of the pixel region into the pixel region on the substrate, resulting in a suppressed photocurrent flow and an improved switching element.

Since the input terminal pad is connected to the external wiring by thermocompression bonding using an anisotropic conductive film, conductive particles damage the thinned interlayer insulation film after polishing over the dummy pattern region, and short-circuiting to the input terminal pad will occur. When a dummy pattern is formed over the almost entire range other than the external wiring region near the input terminal pads, two adjacent input terminal pads will cause short-circuiting through the dummy pattern.

In the present invention, the dummy pattern arranged on the periphery of the input terminal pads is composed of a plurality of divisional dummy patterns, hence the surface level of the formed interlayer insulation film to be polished is made uniform without short-circuiting between the adjacent terminal pads. The probability of the short-circuiting decreases as the number of divisional dummy patterns increases.

It is preferable that a non-dummy pattern region be provided between two adjacent input terminal pads. The non-dummy pattern region adjoins the wire of the flexible tape wiring which is compressed during the thermocompression bonding. If the dummy patterns are continuously formed, conductive particles in the anisotropic conductive film will raise the probability of short-circuiting between a terminal pad and dummy pattern, causing short-circuiting between two terminal pads through the dummy pattern. The formation of the non-dummy pattern can securely prevent such undesirable short-circuiting.

The distance between the input terminal pad and the divisional dummy pattern on its periphery is set to be larger than the distance between the wiring and the dummy pattern near the wiring in order to prevent as much as possible bridging and thus short-circuiting between the input terminal pad and the divisional dummy pattern through the conductive particles in the anisotropic conductive film.

The distance between the relay terminal pad and the dummy pattern on its periphery is set to be larger than the distance between the wiring and the dummy pattern near the wiring. Generally silver paste causes conduction on the relay terminal pad. Silver paste on the relay terminal pad will not cause short-circuiting to the dummy pattern near the relay terminal pad even if the silver paste slightly spreads out of the relay terminal pad.

In order to achieve the second object, a second means of the present invention is characterized in that dummy patterns composed of a single or plural conductive layers lying under the interlayer insulation film to be polished are provided on the sealing region surrounding the pixel region as well as near the terminal pad. When no dummy pattern is provided in the sealing region, the interlayer insulation film tends to have a slanted surface at the periphery of the pixel region before polishing. Such a slanted surface causes a low reflectance of the shading film of the upper conductive layer and a difficulty in optimization of the etching time for the formation of the hole due to an uneven thickness of the interlayer insulation film after polishing. The provision of the dummy pattern can solve such problems. The surface level of the unpolished interlayer insulation film is substantially uniform over the entire region, including the sealing region, near the pixel region, hence the polished interlayer insulation film barely has a slanted surface and an uneven thickness in the pixel region.

If no dummy pattern is provided at the exterior of the sealing region provided with a dummy pattern, the interlayer insulation film on the sealing region has a slanted surface after polishing. The slanted surface will disturb the control of the gap between two substrates (referred to as a cell gap) when adhering to the counter substrate in fabrication of an electro-optical device and cause a drawback to adhesiveness of the sealing agent.

It is preferable that a dummy pattern be provided at the peripheral region of the sealing region in order to solve these problems.

The dummy pattern may be the first dummy pattern composed of the first conductive layer electrically connected to the switching element, the second dummy pattern composed of the second conductive layer lying between the first conductive layer and the upper conductive layer such as the shading film, or a composite dummy pattern of the first and second dummy patterns.

Preferably, the dummy pattern provided at the sealing region and the peripheral region of the sealing region is formed on an isolated pattern which is the same layer as the control wiring layer of the switching element. Also, if required, the dummy pattern near the terminal pad region is preferably formed on an isolated pattern which is the same layer as the control wiring layer of the switching element. By using the pattern as a base plate for raising the bottom, planarization of the surface level of the polished interlayer insulation film can be more precisely controlled.

Further, the present invention is characterized in that a single or plural dummy patterns composed of conductive layer underlying the interlayer insulation film to be polished are provided at the neighboring region of the driver circuit which is provided at the periphery of the pixel region and supplies signals to the switching element. The provision of the dummy pattern at the medial region between the sealing region and the pixel region helps planarization of the interlayer insulation film by polishing. The dummy pattern may be the first dummy pattern composed of the first conductive layer, the second dummy pattern composed of the second conductive layer, or a composite dummy pattern of the first and second dummy patterns.

Further, the present invention is characterized in that a single or plural dummy patterns are provided at the corner region of the sealing region which is provided at the periphery of the pixel region, and the dummy patterns are composed of conductive layer underlying the interlayer insulation film to be polished and have a lower density than that of the periphery of a side region of the sealing region and the periphery of the corner region of the sealing region formed on the periphery of the pixel region. In the corner region of the sealing region, a plurality of divisional dummy patterns are distributed as groups, and the dummy patterns are different from wide continuous dummy patterns at the sealing side and on the periphery of the corner region. The surface roughness of the unpolished interlayer insulation film at the four-corner sealing portion is therefore reflected by the unevenness due to the divisional dummy patterns, and the four-corner portion has a higher initial polishing rate compared to the four-corner portion having a continuous wide dummy pattern. As a result, the polishing rate at the four-corner portion is equalized to that in the sealing region, and a change in residual thickness can be reduced in the pixel region and the sealing region.

The corner portion is indented and the boundary portion is cornered in the sealing region formed on the periphery of the pixel region, even when a single or plural dummy patterns composed of conductive layer underlying the interlayer insulation film to be polished are formed at the sealing region excluding the corner region, that is, even when no dummy pattern is formed at the four-corner portion. The boundary portion is therefore easily polished at the initial stage and a slanted surface is formed. The slanted surface gradually extends to the inner pixel region and the sealing region. Accordingly, the pixel region and the sealing region can be flattened or planarized as a whole.

Such dummy patterns may be the first dummy pattern composed of the first conductive layer, the second dummy pattern composed of the second conductive layer, or a composite dummy pattern of the first and second dummy patterns.

Also, the present invention is characterized in that a plurality of uneven pseudo pixel patterns including the conductive layer lying under the interlayer insulation film to be polished are formed at the non-pixel region on the substrate instead of the forming a continuous wide dummy pattern in the non-pixel region. In the substrate having uneven pseudo dummy patterns, since the unpolished interlayer insulation film at the non-pixel region and the pixel region have very similar uneven surface patterns, the initial polishing rate is almost equalized over the entire substrate and a highly precise surface flatness can be achieved at least in the pixel and sealing regions.

It is preferable that a plurality of uneven pseudo pixel patterns are formed repeatedly in the direction of two dimensions on the substrate such that the arrangement has spatial regularity. The regularity corresponds to the spatial regularity of the uneven pixel pattern such as matrix in the pixel region. The surface over the pixel region and the sealing region is further significantly flattened or planarized.

The uneven pseudo pixel pattern may be the first dummy pattern composed of the first conductive layer, the second dummy pattern composed of the second conductive layer, or a composite dummy pattern of the first and second dummy patterns. A pseudo pixel pattern including the pattern of the interlayer insulation film will more closely imitate the pixel pattern.

Preferably, the uneven pseudo pixel pattern is formed of at least a pseudo gate line and a pseudo data line. These form typical unevenness in the pixel and are concerned with regularity of unevenness in the pixel region.

An electro-optical device is fabricated using the electro-optical device substrate, and is suitable for use in display portions of various electronic devices, for example, a light valve of a projection display device.

BRIEF DESCRIPTION OF THE DRAWINGS

FIG. 9 is a partial plan view of the periphery of the relay terminal pad in the reflective liquid crystal panel substrate in accordance with Embodiment 1;

FIG. 10 is a contour plot of film illustrating the thickness distribution of the third interlayer insulation film after polishing of the liquid crystal panel substrate in accordance with Embodiment 1, in which the third interlayer insulation film with a thickness of approximately 24,000 Å is formed and then subjected to the CMP treatment until the residual thickness of the third interlayer insulation film reaches approximately 12,000 Å in the center of the pixel region;

DETAILED DESCRIPTION OF PREFERRED EMBODIMENTS

The embodiments in accordance with the present invention will now be described with reference to the attached drawings.

Figure 1:
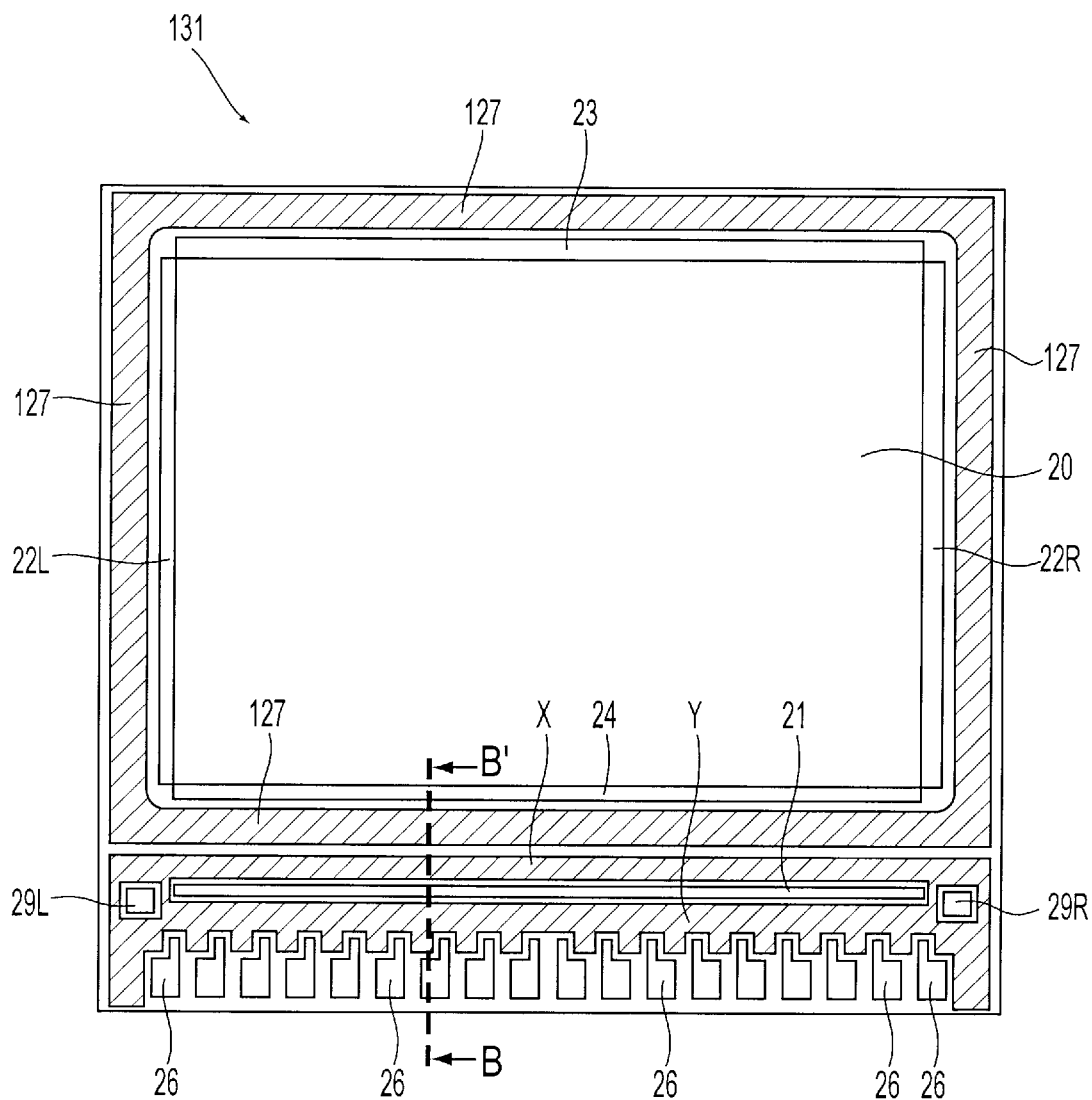
FIG. 1 is a plan view of a layout of a reflective liquid crystal panel substrate for a reflective liquid crystal panel in accordance with Embodiment 1 of the present invention.
Figure 2:
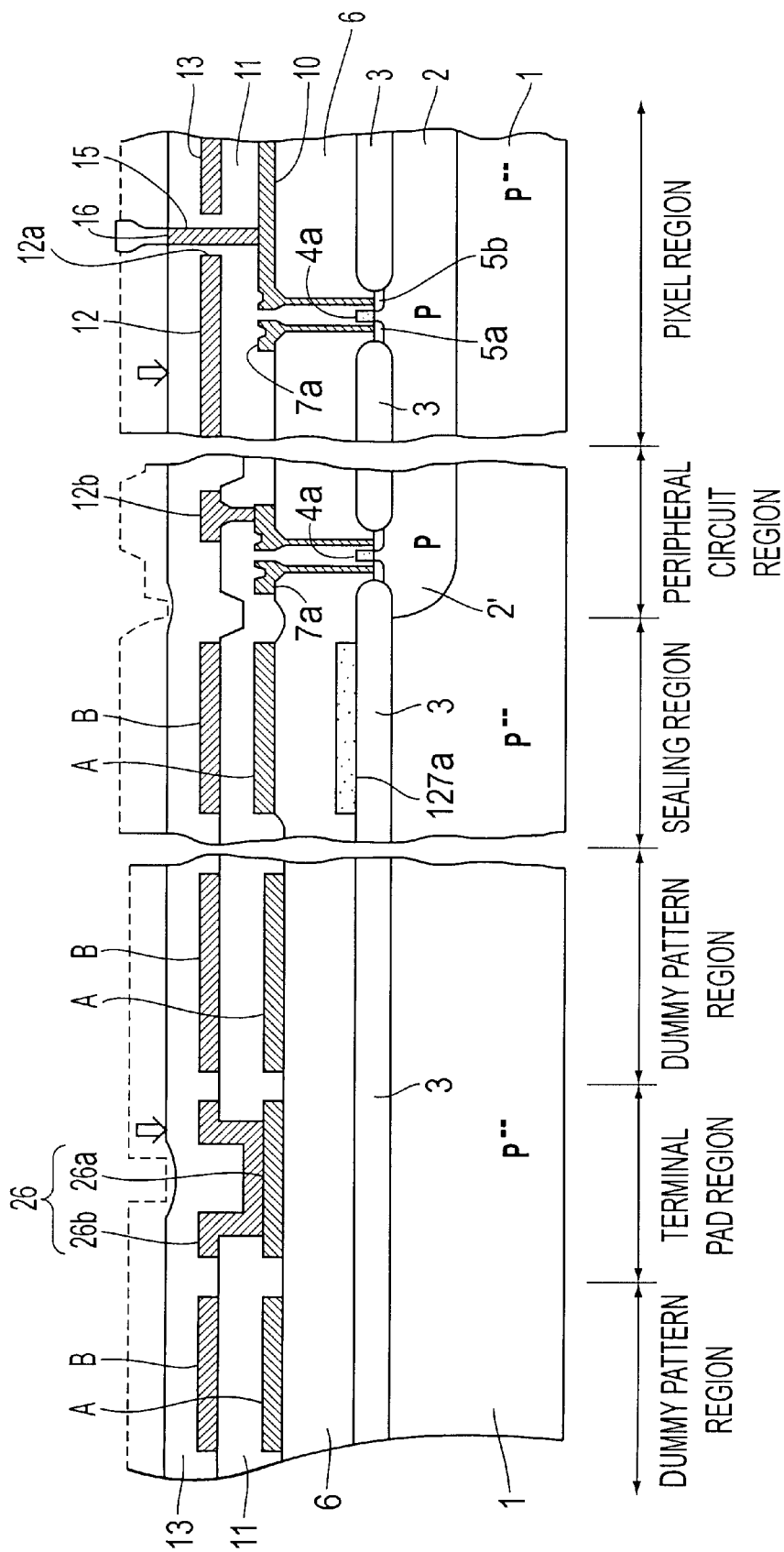
FIG. 2 is a cross-sectional view taken along the line B–B' in FIG. 1.

FIG. 1 is a plan view of a layout of a reflective liquid crystal panel substrate for a reflective liquid crystal panel in accordance with Embodiment 1 of the present invention, and FIG. 2 is a cross-sectional view taken along the line B–B' in FIG. 1.

Figure 18:
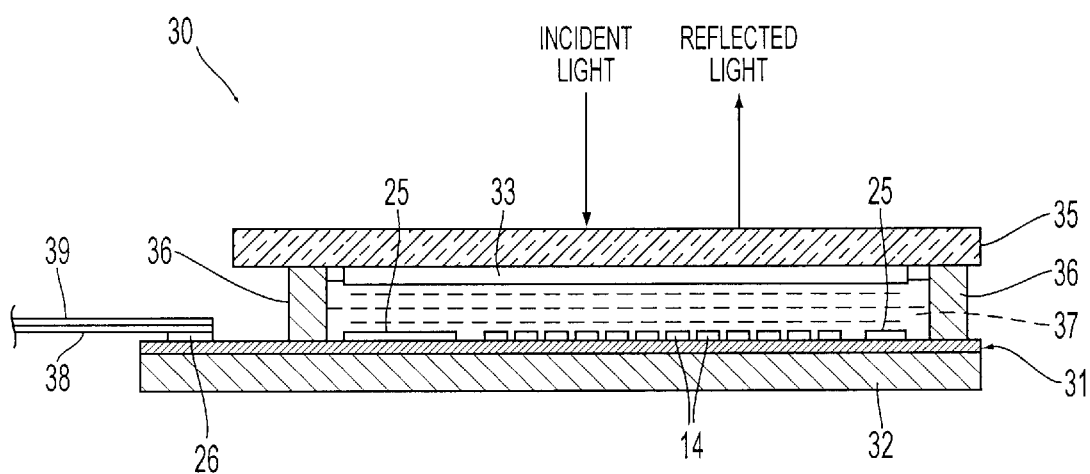
FIG. 18 is a cross-sectional view of a reflective liquid crystal panel.
Figure 19:
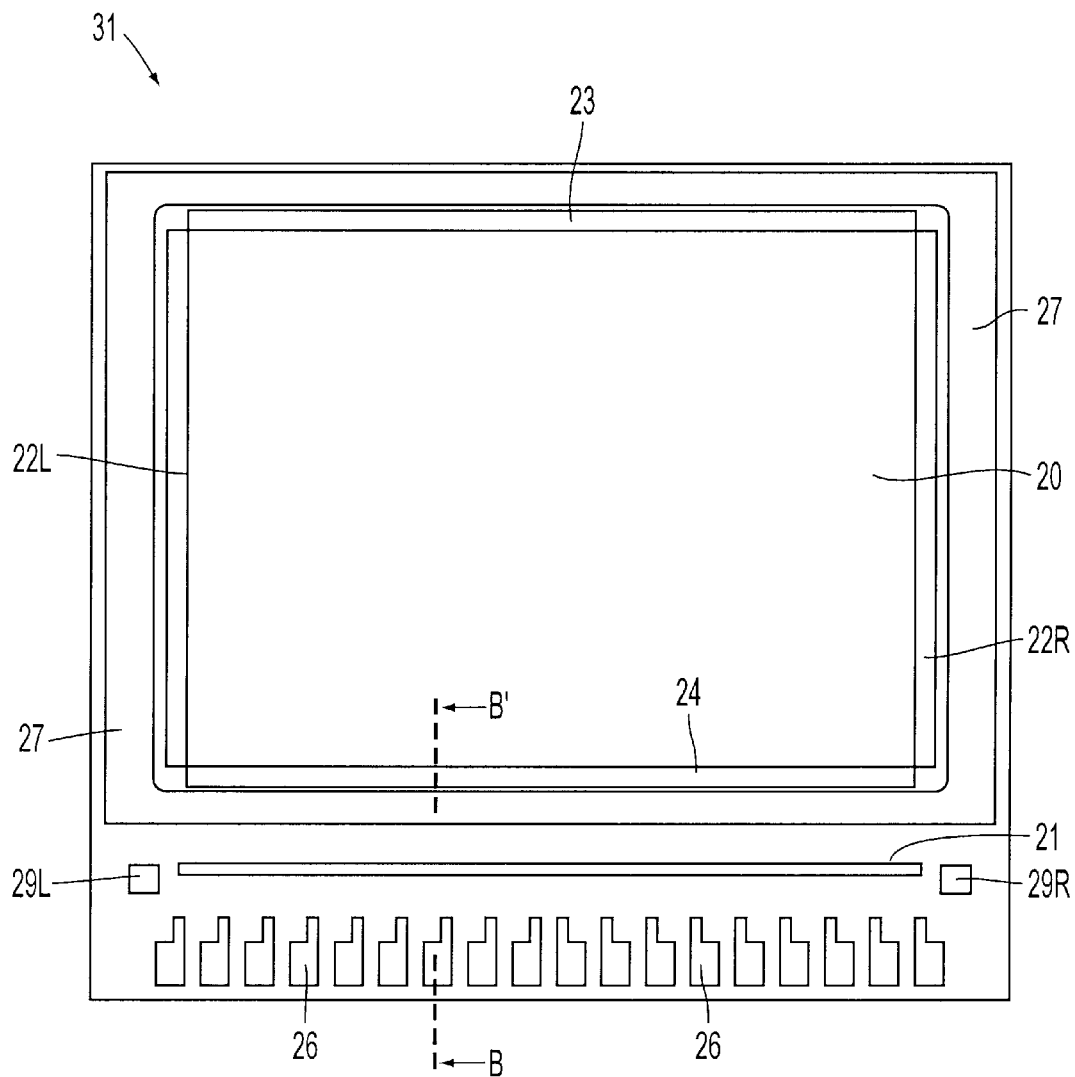
FIG. 19 is a plan view of a reflective liquid crystal panel substrate used in a conventional reflective liquid crystal panel.

The reflective liquid crystal panel substrate 131 in accordance with this embodiment shown in FIG. 1 includes, as in the conventional liquid crystal panel substrate 31 shown in FIGS. 18 and 19, a rectangular pixel region (display region) 20 provided with a matrix of pixel electrodes 14 shown in FIG. 18; gate line driver circuits(Y drivers) 22R and 22L lying at the exteriors of the right and left sides of the pixel region 20 for scanning gate lines (scanning electrodes or line electrodes); a precharging/testing circuit 23 for data lines (signal electrodes or column electrodes); an image signal sampling circuit 24 lying at the exterior of the bottom side of the pixel electrodes 14 for supplying image signals to the data lines in response to the image data; a sealing region 127 lying at the exterior of the gate line driver circuits 22R and 22L, the precharging/testing circuit 23 and the image signal sampling circuit 24, for placing a sealing agent 36 (refer to FIG. 18); a plurality of terminal pads 26 arranged along the bottom end and adhesively connected to a flexible tape wiring with an anisotropic conductive film therebetween; a data line driver circuit(X driver) 21 lying between the terminal pad array 26 and the bottom side of the sealing region 127 for supplying sampling signals to the image signal sampling circuit 24; and relay terminal pads (so-called silver points) 29R and 29L lying beside both ends of the data line driver 21 for energizing the counter electrode 33 on the glass substrate 35. Each of the gate line driver circuits 22R and 22L and the data line driver circuit 21 has a shift register to supply scanning signals to the gate lines and sampling signals to the image signal sampling circuit 24, respectively, in response to transmission of shift data in the shift register. The signal sampling circuit 24 supplies image signals to the data lines in response to sampling signals.

In this embodiment, the sealing region 127 having a frame shape and surrounding the pixel region 20 forms an isolated wide-continuous dummy pattern region as shown by hatching. The input terminal pads 26, the relay terminal pads 29R and 29L and the data line driver circuit 21 are surrounded by the wide continuous dummy pattern region as shown by the hatching.

Figure 20:
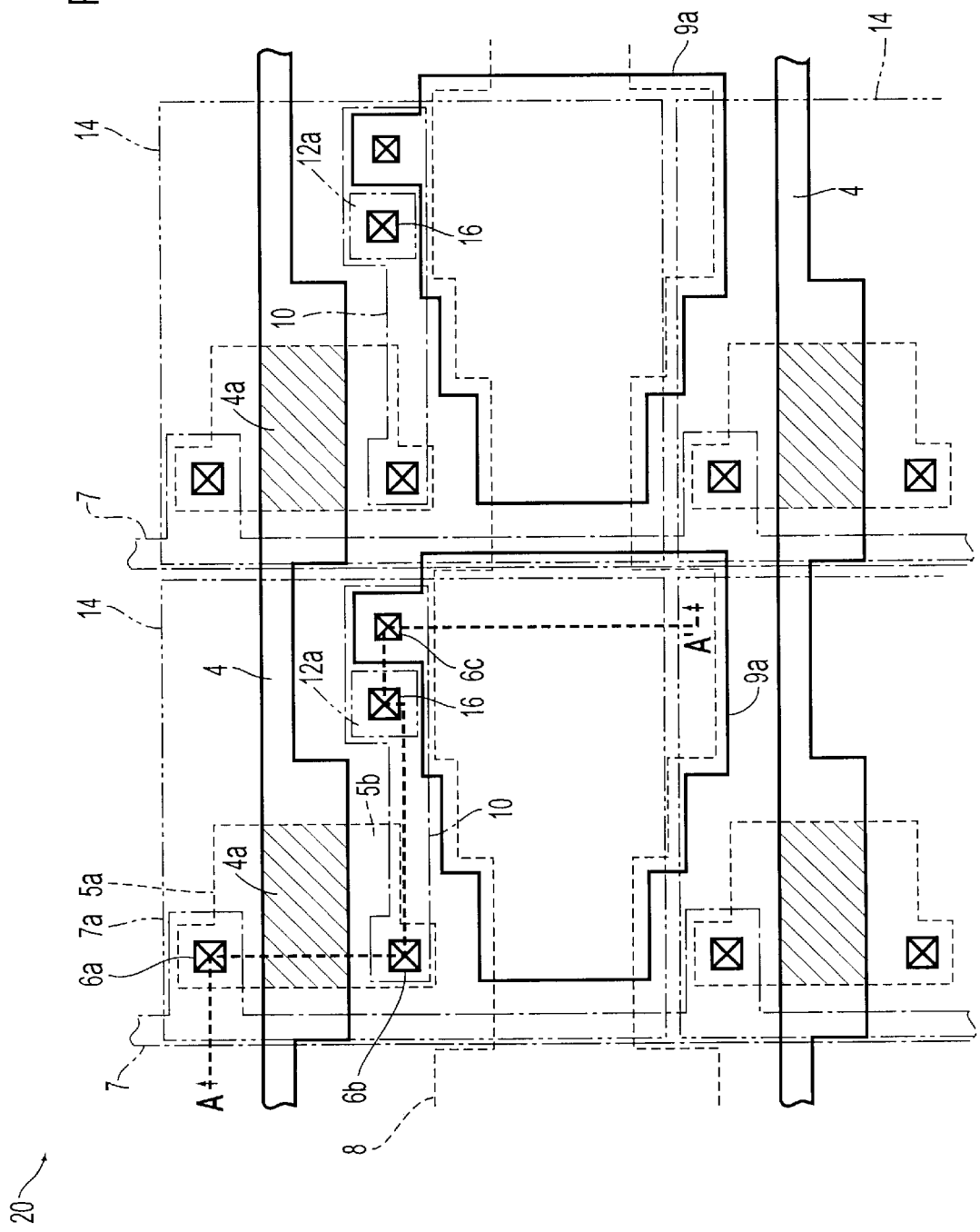
FIG. 20 is a partial plan view of the pixel region of the reflective liquid crystal panel substrate in FIG. 19.
Figure 21:
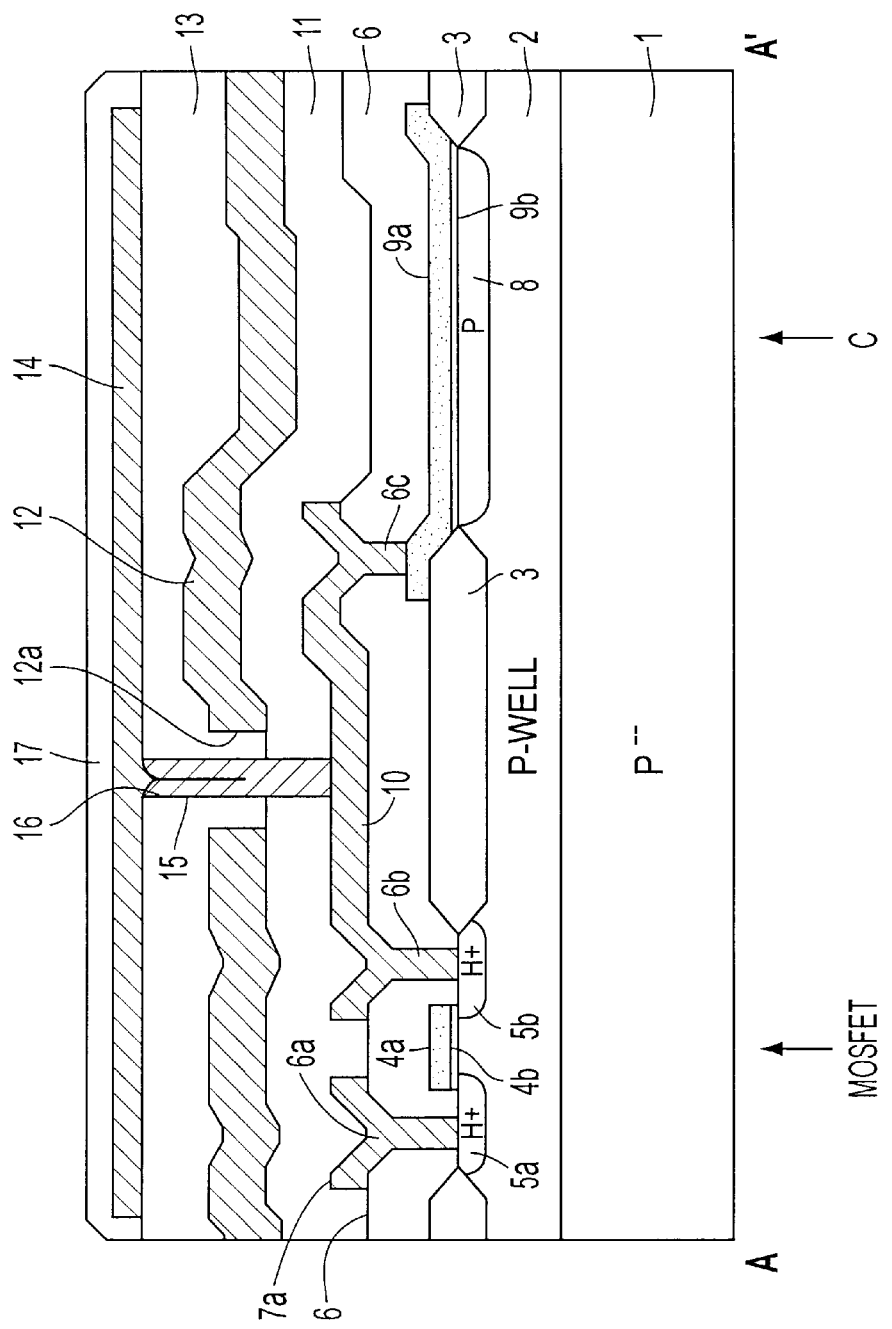
FIG. 21 is a cross-sectional view taken along the line A–A' of FIG. 13.
Figure 22:
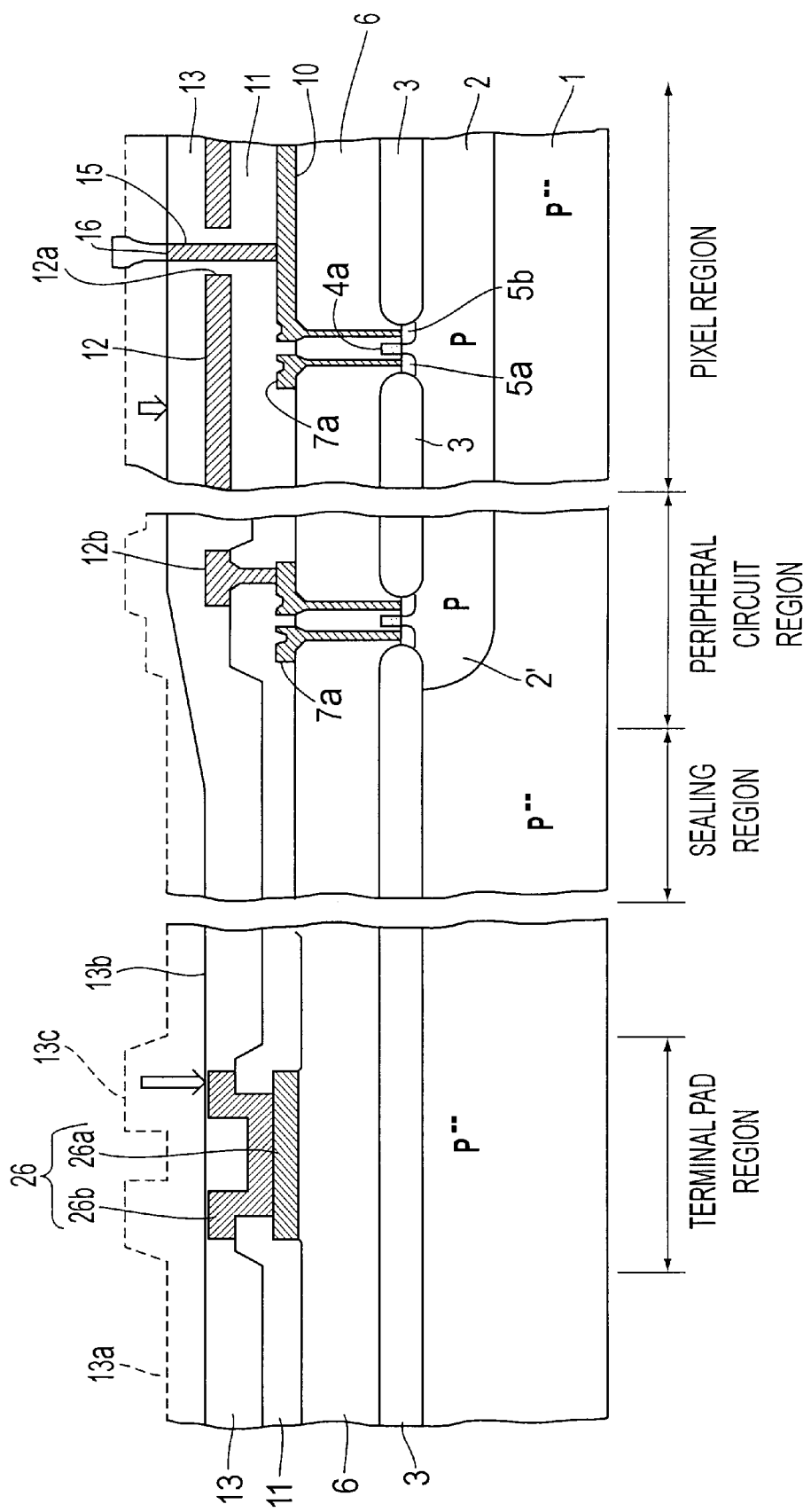
FIG. 22 is a cross-sectional view taken along the line B–B' of FIG. 12.

The plan and sectional configurations of the pixel region 20 of the panel substrate 131 are the same as those shown in FIGS. 20 and 21, respectively. As shown in FIG. 2, a P-type well region 2 is formed on the top surface of a $P^-$ semiconductor substrate 1 (a $N^-$ semiconductor substrate is also available) composed of single-crystal silicon having a large size (a side of approximately 20 mm), and a field oxide film (so-called LOCOS film) 3 is formed thereon. The p-type well region 2 is formed as a common well region for the pixel region 20 provided with a matrix of pixels having dimensions of, for example, 768×1024, and it is separated from a P-type well region 2' for fabricating the devices of the peripheral circuits (the gate line driver circuits 22R and 22L, the precharging/testing circuit 23, the image signal sampling circuit 24 and the data line driver circuit 21).

The field oxide film 3 is provided with two openings at the divided region of each pixel. A gate electrode 4a composed of polycrystalline silicon or a metal silicide is formed via a gate insulating film 4b in the center of one opening; an $N^+$ source region 5a, and an $N^+$ drain region 5b formed on the P-type well region 2 at the both sides of the gate electrode 4a form a switching element, that is, a N-channel MOSFET (insulated-gate field effect transistor) for pixel selection together with the gate electrode 4a. As shown in FIG. 20, the gate electrodes 4a in a plurality of pixels arrayed in a line extend in the scanning line direction (the line direction of the pixels) to form gate lines 4.

Although not shown in FIG. 2, a P-type capacitor electrode region 8, which is common to the line, is formed on the P-type well region 2 in the other opening. A capacitor electrode 9a composed of polycrystalline silicon or a metal silicide formed on the P-type capacitor electrode region 8 with an insulating film (dielectric film) 9b therebetween forms a retention capacitor (accumulating capacitor) C for retaining a signal selected by the MOSFET for pixel selection together with the P-type capacitor electrode region 8.

The retention capacitor 9a can be formed by a film deposition process for a polycrystalline silicon or metal silicide layer which functions as the gate electrode 4a in the MOSFET for pixel selection. The insulating film (dielectric film) 9b under the retention capacitor 9a can also be formed by an insulating film deposition process for the gate insulating film 4b. The insulating films 9b and 4b are formed by a thermal oxidation process and have thicknesses of approximately 400 Å to 800 Å. The capacitor electrode 9a and gate electrode 4a have a composite structure of a polycrystalline silicon layer with a thickness of 1,000 Å to 2,000 Å and a silicide layer of a high melting point metal such as Mo or W having a thickness of 1,000 Å to 3,000 Å. The source and drain regions 5a and 5b are formed by a self-alignment ion implantation process of an N-type impurity on the surface of the substrate at both sides of the gate electrode 4a acting as a mask.

The P-type capacitor electrode region 8 is formed by a doping process including ion implantation and heat treatment (drive-in). Ion implantation may be performed before the gate electrode is formed. After the formation of the insulating film 9b, the same impurity as in the P-type well 2 is doped such that the surface of the P-type well 2 has a higher impurity content than its interior and forms a low resistance layer. The impurity content in the P-type well 2 is preferably $1 \times 10^{17}$ cm$^{-3}$ or less and more preferably ranges from $1 \times 10^{16}$ cm$^{-3}$ to $5 \times 10^{16}$ cm$^{-3}$. The preferable impurity content in the source and drain regions 5a and 5b ranges from $1 \times 10^{20}$ cm$^{-3}$ to $3 \times 10^{30}$ cm$^{-3}$. The preferable impurity content in the P-type capacitor electrode region 8 ranges from $1 \times 10^{18}$ cm$^{-3}$ to $5 \times 10^{19}$ cm$^{-3}$, and more preferably from $1 \times 10^{18}$ cm$^{-3}$ to $1 \times 10^{19}$ cm$^{-3}$ in view of reliability and pressure resistance of the insulating film 9b as a constituent of the retention capacitor C.

A first interlayer insulation film 6 is formed on the gate electrode 4a and the capacitor electrode 9a, and a first conductive layer (hereinafter referred to as a first metal layer) essentially consisting of aluminum is formed on the insulating film 6. The first metal layer includes data lines 7 extending in the column direction (refer to FIG. 20), source electrode wirings 7a, which extend from the data line 7 like a comb and come into conductive contact with the source region 5a through a contact hole 6a, a relay wiring 10 coming into conductive contact with the drain region 5b through the contact hole 6b and with the capacitor electrode 9a through a contact hole 6c.

The first interlayer insulation film 6 is formed by, for example, depositing an HTO film (a silicon oxide film formed by a high-temperature CVD process) with a thickness of approximately 1,000 Å and depositing a BSPG film (a silicate glass film containing boron and phosphorus) with a thickness of approximately 8,000 Å to 10,000 Å. The first metal layer forming the source electrode wiring 7a and the relay wiring 10 has, for example, a quadrilayer structure composed of Ti/TiN/Al/TiN in that order from the bottom.

The bottom Ti layer has a thickness of approximately 100 Å to 600 Å, the second TiN layer has a thickness of approximately 1,000 Å, the third Al layer has a thickness of approximately 4,000 Å to 10,000 Å, and the top TiN layer has a thickness of approximately 300 Å to 600 Å.

A second interlayer insulation film 11 is formed on the first metal layer, and a second conductive layer (hereinafter referred to as a second metal layer) composed of aluminum is formed on the second interlayer insulation film 11. The second metal layer covers most of the pixel region 20 and includes a shading film 12 for shielding the spacing portion between two adjacent pixel electrodes 14. The second metal layer forming the shading film 12 is used as a connecting wiring 12b (refer to FIG. 2) in the peripheral circuits (the gate line driver circuits 22R and 22L, the precharging/testing circuit 23, the image signal sampling circuit 24 and the data line driver circuit 21).

The second interlayer insulation film 11 is formed by, for example, depositing a silicon oxide film (hereinafter referred to as TEOS film) with a thickness of approximately 3,000 Å to 6,000 Å from tetraethyl ortho-silicate (TEOS) by a plasma CVD process, depositing a spin-on-glass (SOG) film thereon, etching it by an etch-back process, and depositing a second TEOS film with a thickness of approximately 2,000 Å to 5,000 Å thereon.

The second metal layer forming the shading film 12 and the like may have the same configuration as the first metal layer, for example, a quadrilayer structure of Ti/TiN/Al/TiN formed from the bottom.

The bottom Ti layer has a thickness of approximately 100 Å to 600 Å, the second TiN layer has a thickness of approximately 1,000 Å, the third Al layer has a thickness of approximately 4,000 Å to 10,000 Å, and the top TiN layer has a thickness of approximately 300 Å to 600 Å.

A plug hole 12a is provided at a position of the shading film 12 corresponding to the relay wiring 10. A third interlayer insulation film 13 is formed on the shading film 12, and a rectangular pixel electrode 14 which substantially corresponds to one pixel is formed as a reflective electrode on the interlayer insulation film 13. The third interlayer insulation film may be formed as in the second interlayer insulation film 11, that is, by depositing a TEOS film with a thickness of approximately 3,000 Å to 6,000 Å, depositing a SOG film thereon, etching it by an etch-back process, and depositing a second TEOS film with a thickness of approximately 16,000 Å to 24,000 Å. Alternatively, the third interlayer insulation film may be formed of only the TEOS film instead of the SOG film interposed between two TEOS films. The thickness in this case preferably ranges from 16,000 Å to 24,000 Å. A silicon nitride film may be formed under or on the TEOS film in order to improve humidity resistance. When the silicon nitride film is the upper layer, the TEOS film is flattened by a CMP process before depositing the silicon nitride film or the silicon nitride film is flattened by a CMP process.

A contact hole 16 is formed through the third and second interlayer insulation films 13 and 11 so that it is located inside the opening 12a of the shielding film 12. After the contact hole 16 is filled with a high-melting-point metal such as tungsten by a CVD process, the high-melting-point metal layer formed on the third interlayer insulation film 13 and the front face of the interlayer insulation film 13 are flattened to form a mirror surface by a chemomechanical polishing (CMP) process. The residual thickness of the interlayer insulation film 13 after polishing is adjusted to be approximately 4,000 Å to 10,000 Å at the thinnest portion.

Next, an aluminum layer with a thickness of approximately 300 Å to 5,000 Å is formed by a low temperature sputtering process and a rectangular pixel electrode 14 with a side of 15 μm to 20 μm is formed by a patterning process. A connecting plug (interlayer conductive portion) 15 composed of a high-melting-point metal electrically connects the relay wiring 10 and the pixel electrode 14, skipping one metal layer of the shading layer 12. The connecting plug 15 may be formed by planarizing the third interlayer insulation film 13 by a CMP process, providing a contact hole, and embedding a high-melting-point metal such as tungsten therein. Alternatively, the opening 12a in the second metal layer 12 may be enlarged, a second relay wiring composed of a second metal layer 12 and having, for example, a rectangular shape may be formed in the opening 12a, the first relay wiring 10 and the second relay wiring may be connected to each other, and the second relay wiring may be the connected to the pixel electrode 14 by the connecting plug 15. A passivating film 17 with a thickness of approximately 500 Å to 2,000 Å composed of silicon oxide or the like is formed on the entire pixel electrode 14. An alignment film is formed on the entire passivating film 17 and subjected to rubbing treatment in the fabrication of the liquid crystal panel. In this embodiment, although the pixel electrode 14 is formed of a third conductive layer (hereinafter referred to as a third metal layer), it may be formed in the upper layer when the substrate is formed by a process for depositing a plurality of metal layers. The pixel electrode 14 is formed of the uppermost metal layer in all the cases.

A silicon oxide film is used as the passivating film 17 which covers the pixel region 20 as described above, whereas a silicon nitride film with a thickness of approximately 2,000 Å to 10,000 Å is used in the peripheral circuit region, sealing region and the scribe portion. A dielectric mirror film may be formed on the passivating film 17.

As shown in FIG. 1, the pixel region 20, which occupies most of the rectangular semiconductor device 1, is surrounded by the sealing region 127 having a frame shape. The sealing region 127 forms a border region between the pixel region 20 and a non-pixel region not containing the liquid crystal (the peripheral circuit region, the terminal pad region, and the scribe region). In this embodiment, the sealing region 127 includes parts of the peripheral circuits (the gate line driver circuits 22R and 22L, the precharging/testing circuit 23, and the image signal sampling circuit 24), and thus only the data line driver circuit 21 lies at the exterior of the sealing region 127. Of course, the data line driver circuit 21 may also lie at the interior of the sealing region 127.

The cross-sectional configuration of the sealing region 127 in this embodiment includes, as shown in FIG. 2, a wide continuous pattern 127a composed of polycrystalline silicon or a metal silicide, which is formed on the field oxide film 3 and separated from the gate electrode 4a, a wide continuous lower dummy pattern A composed of the first metal layer, and an isolated wide-continuous upper dummy pattern B composed of the second metal layer. The pattern 127a may be formed by the process for the gate electrode 4a. The dummy patterns A and B may be formed by the process for the first and second metal layers, respectively. The surface level of the third interlayer insulation film 13 is uniformly raised by the thickness corresponding to the thicknesses of the pattern 127a and the dummy patterns A and B, and is substantially equal to the surface level of the pixel region and the peripheral circuit region.

The periphery of the data line driver circuit 21 lying at the exterior of the sealing region 127 and the peripheries of the relay terminal pads 29R and 29L and the input terminal pad 26 as shown by hatching in FIGS. 4 to 6 and FIG. 9, other than the wiring region, form a dummy pattern region which is electrically floating or clamped by the power source voltage. The input terminal pad 26 in this embodiment has a structure piled with the lower layer 26a as the first metal layer and the upper layer 26b as the second metal layer, and the cross-sectional configuration of the dummy pattern region includes the wide continuous lower dummy pattern A as the first metal layer which is formed on the first interlayer insulation film 6 on the field oxide film 3, and the wide continuous upper dummy pattern B as the second metal layer which is formed on the second interlayer insulation film 11. The dummy patterns A and B may be formed by the process for the metal layer. The surface level of the third interlayer insulation film 13 is uniformly raised by the thickness corresponding to the thicknesses of the dummy patterns A and B immediately after the formation of the film, and the level just above the input terminal pad 26 is substantially equal to the surface level of the pixel region and the peripheral circuit region by the raising effect at the neighboring regions.

Figure 4:
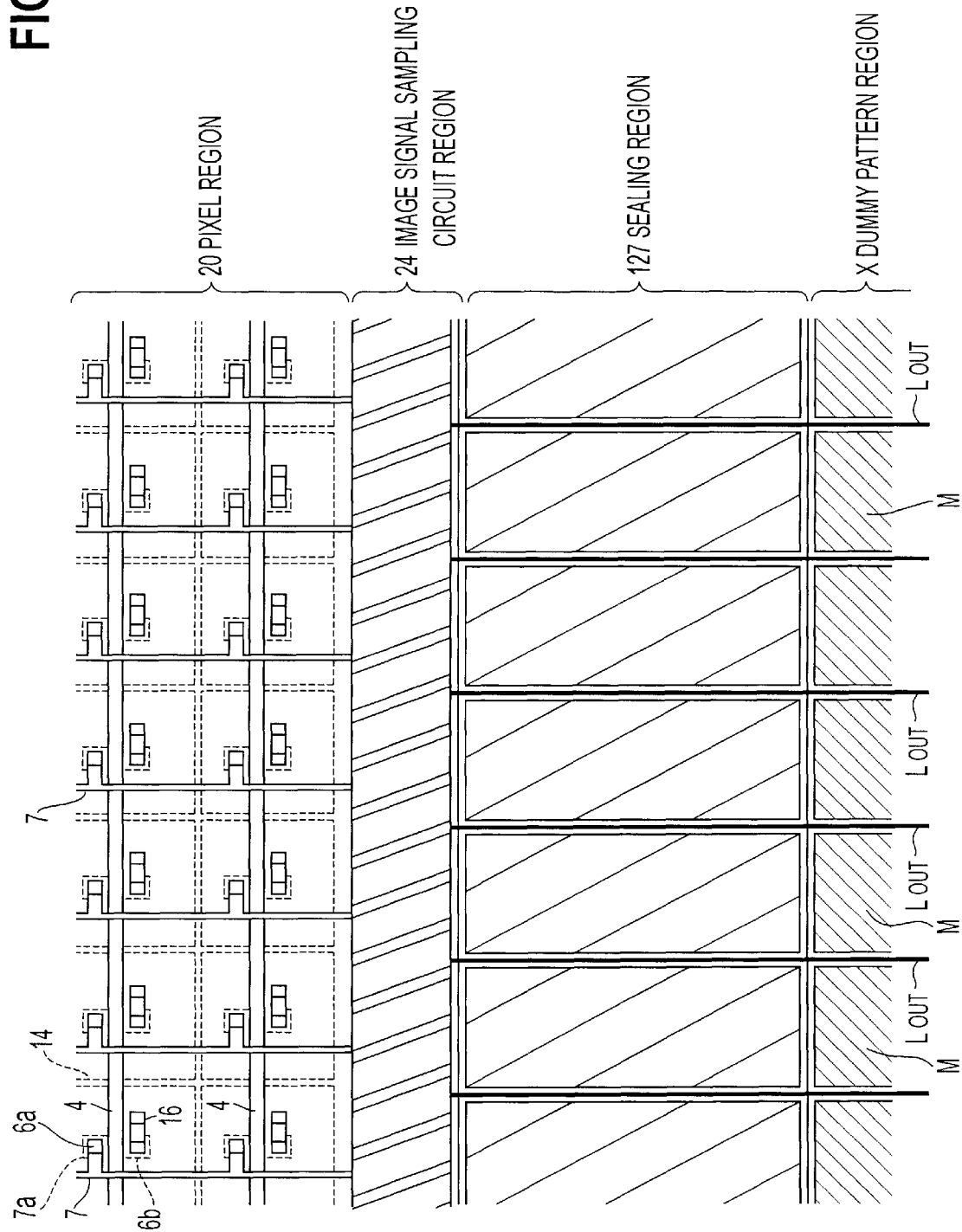
FIG. 4 is a partial plan view near the pixel region and the sealing region in the reflective liquid crystal panel substrate in Embodiment 1.
Figure 5:
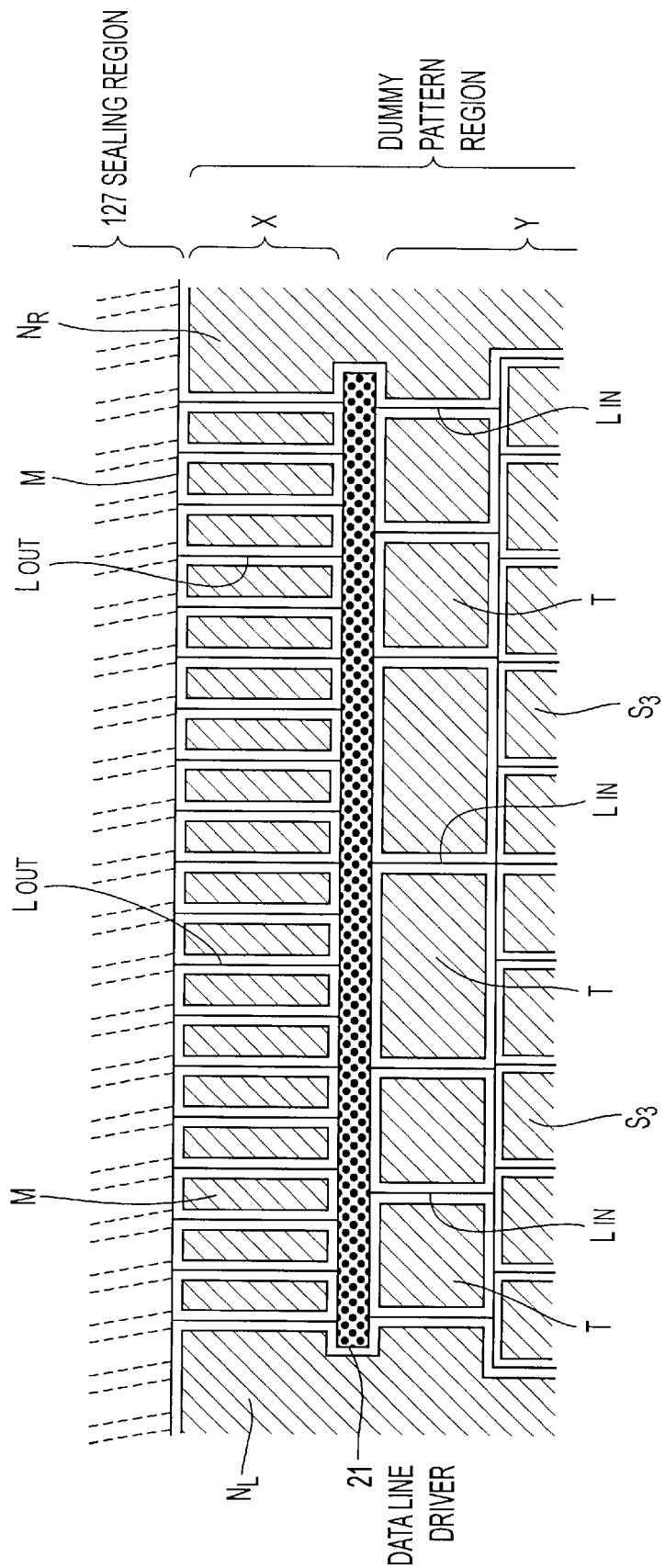
FIG. 5 is a partial plan view near the data line driver circuit in the reflective liquid crystal panel substrate in Embodiment 1.

As shown in FIGS. 4 and 5, isolated rectangular inter-wiring dummy patterns M lie between a plurality of wirings $L_{OUT}$ extending from the data line driver circuit 21 in the border region X between the lower side of the sealing region 127 and the data line driver circuit 21. The interwiring dummy patterns M are also formed by the process for the metal layers.

In the formation of the input terminal pad 26, the upper layer 26b is embedded into a large opening provided in the second interlayer insulation film 11 on the lower layer 26a, hence a large indent is formed on the upper layer 26a, and the third interlayer insulation film 13 just above the upper layer 26a also inevitably has an indent. When the deposition process of the third interlayer insulation film 13 includes the formation of the SOG film, the indent on the upper layer 26a can be moderated to some extent.

Since the area of the input terminal pad 26 is significantly larger than that of the contact hole of the wiring electrode, the indent on the third interlayer insulation film 13 just above the input terminal pad 26 cannot be compensated for only by the additional formation of the SOG film.

Figure 3:
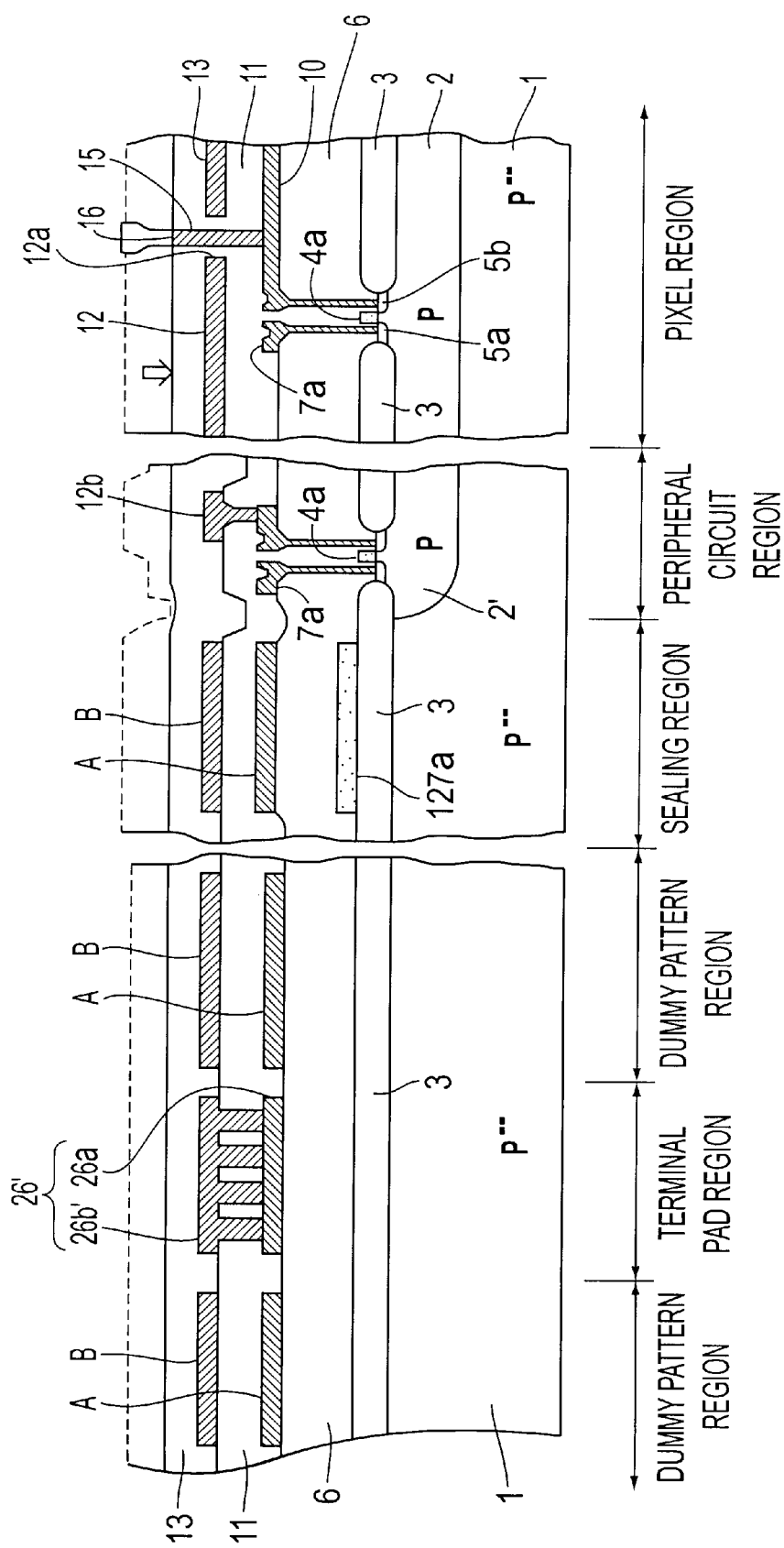
FIG. 3 is a cross-sectional view of another configuration of the input terminal pad corresponding to the sectional structure in FIG. 1.

FIG. 3 is a cross-sectional view of another configuration of the input terminal pad. In FIG. 3, after a plurality of small contact holes are formed on the lower layer 26a, a terminal pad 26' is formed by embedding the upper layer 26b'. In such a configuration, the dropping of the material for the upper layer 26b' into the contact hole is suppressed and fine indents independently form; hence the surface of the upper layer 26b' is flattened. As a result, the surface of the formed third interlayer insulation film 13 is easily flattened without reflecting the fine indents.

In this embodiment as described above, wide continuous dummy pattern regions (dummy patterns A and B) are vertically formed such that the pattern density reaches almost 100% in the entire region at the exterior of the pixel region and the peripheral circuit region, hence the surface level of the third interlayer insulation film 13 after deposition is substantially uniform over the entire substrate. The solid lines in FIGS. 2 and 3 show the polished surface level of the third interlayer insulation film 13 after the CMP polishing treatment. Since the surface of the interlayer insulation film 13 before polishing is not significantly high in the regions of the input terminal pads 26 and 26', a uniform and moderate polishing rate is achieved without exposure of the input terminal pads 26 and 26'. The time for the CMP polishing, and thus the polished depth can be increased compared with the conventional depth (approximately 4,000 Å). Such an advantage of a uniform polishing rate results in a thickness reduction of the third interlayer insulation film 13 after polishing. The aspect ratio of the contact hole 16 provided on the opening 12a of the shading film 12 in the pixel region 20, and the diameter of the connecting plug 15 is reduced to reduce opening area of the opening 12a, resulting in enhanced shielding characteristics. An increased polishing depth can moderate the deep step at the opening 12a, which is formed when the third interlayer insulation film 13 is composed of only the TEOS film, in the CMP polishing process without forming the SOG film. Accordingly, the deposition process for the third interlayer insulation film 13 can be simplified, resulting in improved productivity.

Figure 6:
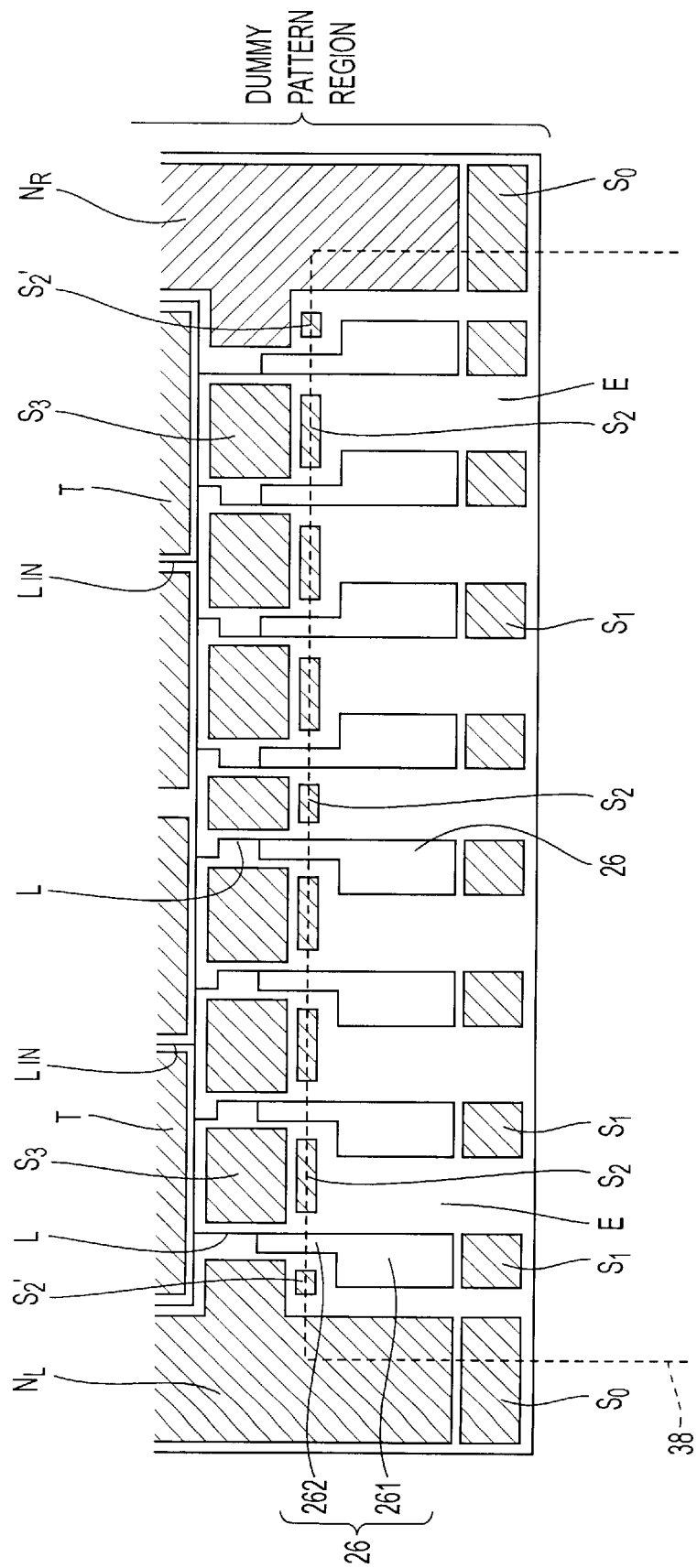
FIG. 6 is a partial plan view near the terminal pads in the reflective liquid crystal panel substrate in Embodiment 1.

As shown by hatching in the planar layout of FIG. 1, the dummy pattern region in this embodiment lies over almost the entire exterior of the sealing region 127 excluding the data line driver circuit 21, the signal wiring, the electric power source wiring, input terminal pads 26, and the relay terminal pads 29R and 29L. As shown in FIGS. 4 and 5, the rectangular interwiring dummy pattern M formed between wirings $L_{OUT}$ and the dummy patterns $N_R$ and $N_L$ at the right and left sides of the substrate are arranged in the interposed region X between the data line driver circuit 21 (including a shift register and a logic circuit forming sampling signals based on the output from the shift register) and the sealing region 127. The distance between a wiring $L_{OUT}$ and the interwiring dummy pattern M is approximately 5 µm. The output wirings $L_{OUT}$ for output of the sample signals extend from the data line driver circuit 21 (the shift register and the logic circuit) to the image signal sampling circuit 24, hence the interwiring dummy pattern has a regular shape. As shown in FIG. 6, there are two types of wirings extending from the region of the input terminal pads 26 to the interior of the substrate, that is, wirings $L_{IN}$ for inputting signals (DXIN (data signals), power source $V_{ddx}$ and $V_{ssx}$, clock signals and inverted clock signals) to the data line driver circuit 21, and wirings L for inputting signals (DYIN (data signals), power source $V_{ddy}$ and $V_{ssy}$, clock signals and inverted clock signals) to the gate line driver circuits 22R and 22L and the precharging/testing circuit 23. Hence the wirings L extracted from the input terminal pads 26 towards the column direction (vertical direction in the drawing) are divided into the wirings $L_{IN}$ directed to the data line driver circuit 21 and the other wirings in the wiring region in the line direction (transverse direction in the drawing). Thus, the input terminal pads 26, a plurality of isolated rectangular divisional dummy patterns $S_1$ to $S_3$ formed between the input wirings, and isolated rectangular interwiring dummy patterns T, formed between the wirings $L_{IN}$ for input to the data line driver circuit 21, lie in the interposed region Y between the region of the input terminal pads 26 and the data line driver circuit 21. In FIG. 6, the number of the shown input terminal pads 26 is reduced.

The planar shape of each input terminal pad 26 includes a rectangular conductive contact portion 261 as a main portion and a wiring extracting portion 262 with a small width extending from the right or left side of the conductive contact portion 261 to the interior of the substrate (in the column direction). The wiring extracting portion 262 of each input terminal pad 26 lying at the right side of the centerline of the substrate is located at the left side of the conductive contact portion 261, whereas the wiring extracting portion 262 of each input terminal pad 26 lying at the left side of the centerline of the substrate is located at the right side of the conductive contact portion 261. The isolated rectangular divisional dummy patterns $S_2$ in the transverse direction are arranged between the wiring extracting portions 262. Further, isolated rectangular divisional dummy patterns $S_3$ are formed between the ends of the wiring extracting portions 262 with wirings L extracted from the wiring extracting portions 262. Also, isolated rectangular divisional dummy patterns $S_1$ are formed beside the edges of the input terminal pads 26 at the side of the substrate.

The dummy patterns $N_R$ and $N_L$ at the right and left sides of the substrate extend to the position of the input terminal pads 26, and isolated divisional dummy patterns $S_2'$ are formed in the spaces beside the wiring extracting portions 262 of the rightmost and leftmost input terminal pads 26. The tips of the dummy patterns $N_R$ and $N_L$ have the same level as the tips of the input terminal pads 26, and isolated divisional dummy patterns $S_0$ are provided beside the tips of the dummy patterns $N_R$ and $N_L$ at the corners of the substrate. The planar shapes of these divisional dummy patterns are not limited to rectangular shapes (including square shapes), and a variety of shapes (triangular, polygonal, and curved) can be selected. For example, hexagonal divisional dummy patterns may be arranged to form a honeycomb shape.

Figure 7:
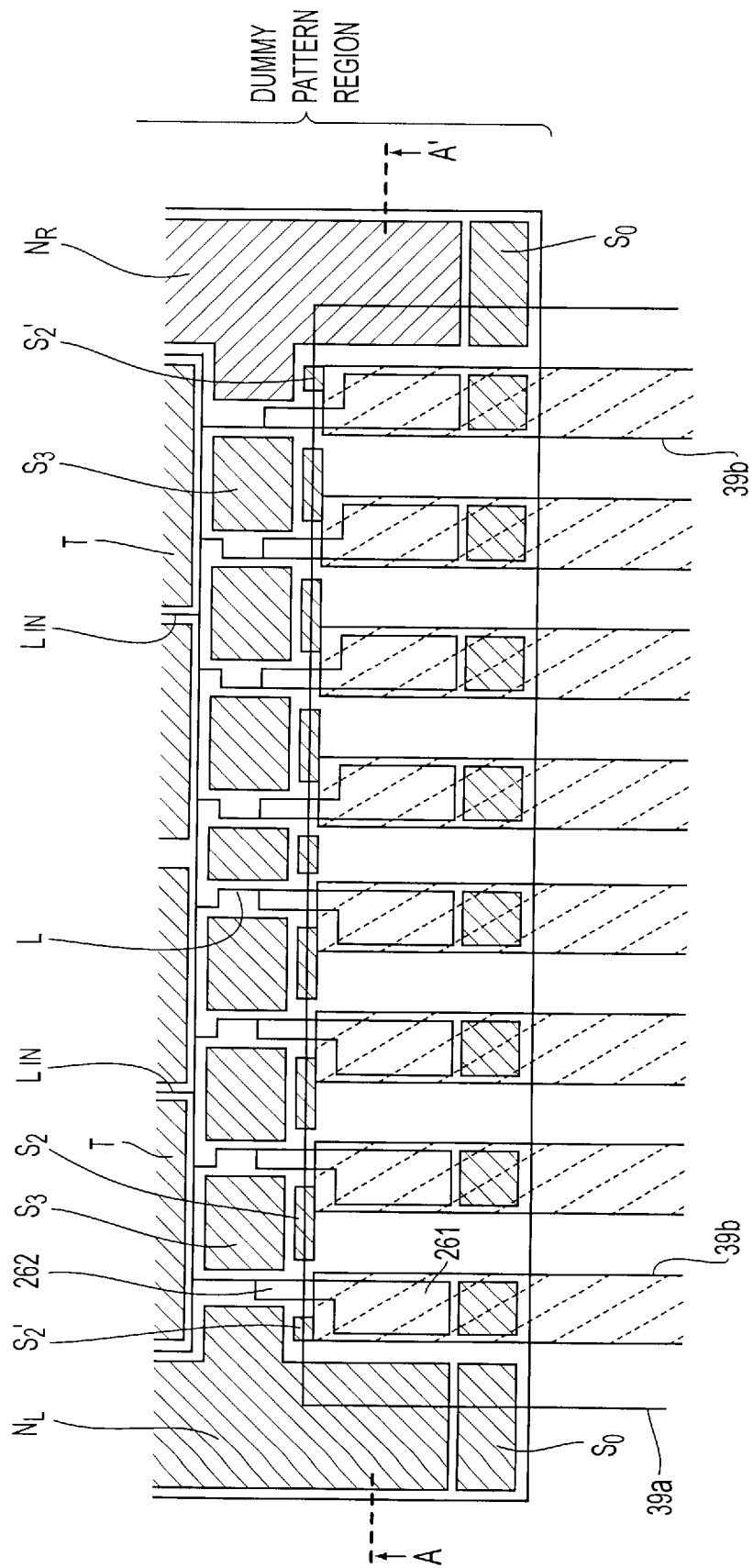
FIG. 7 is a partial plan view illustrating connection between the terminal pads and flexible tape wiring in the reflective liquid crystal panel substrate in Embodiment 1.
Figure 8:
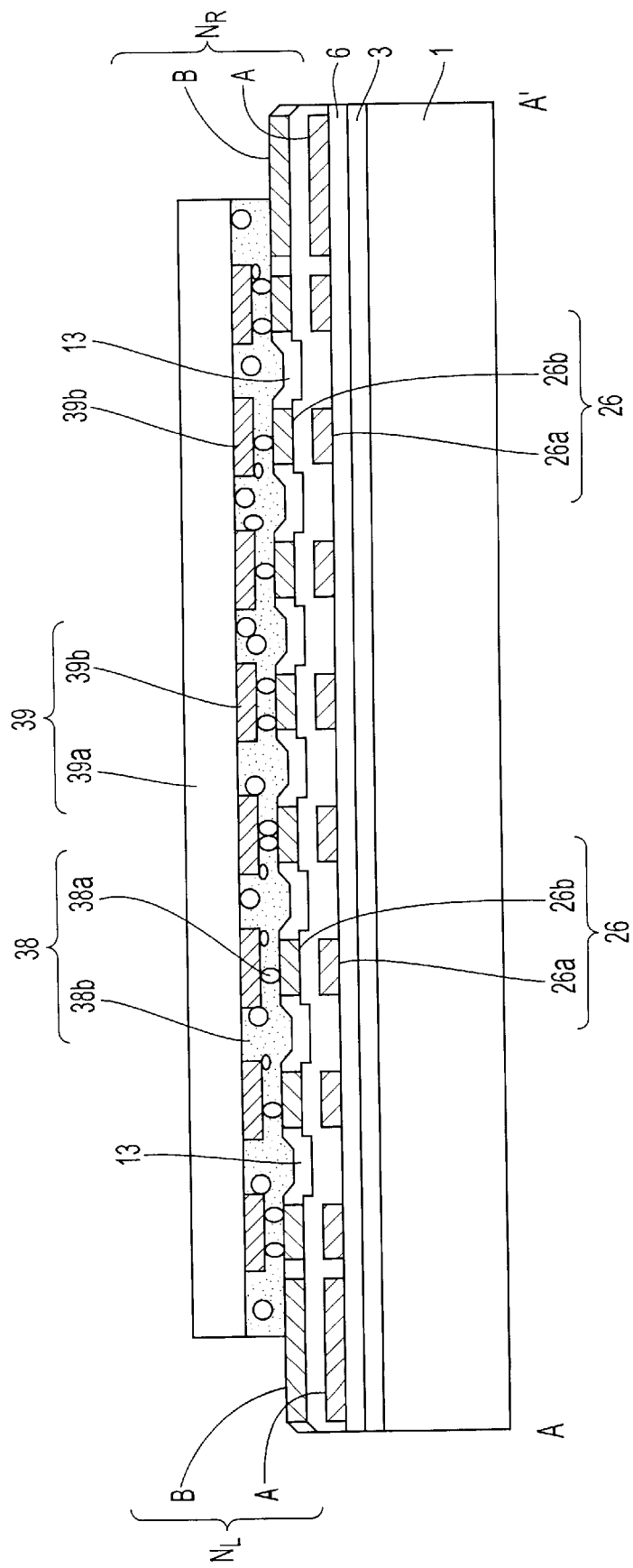
FIG. 8 is a cross-sectional view taken along the line A–A' in FIG. 7.

These input terminal pads 26 are connected to a flexible tape wiring 39 with an anisotropic conductive film (ACF) 38 therebetween by thermocompression bonding as shown in FIG. 18. The broken lines in FIG. 6 represent the edge of the region occupied by the anisotropic conductive film 38. The flexible tape wiring 39 includes, as shown in FIGS. 7 and 8, an insulating flexible tape 39a and a plurality of stripe lead wires 39b bonded thereon. The anisotropic conductive film 38 is interposed between the edge of the flexible tape 39a and the array of the input terminal pads 26.

The anisotropic conductive film 38 is composed of conductive particles 38a with a particle size of approximately 5 µm to 10 µm and an insulating adhesive resin 38b. The flexible tape 39a is compressed so that the thickness is reduced to approximately 2 µm to 10 µm. Since each terminal pad 26 and the corresponding lead wire 39b of the flexible tape wiring 39 are conduct-connected with compressed conductive particles 38a which are discretely distributed, the anisotropic conductive film 38 has conductivity only in the vertical direction. Also in FIGS. 7 and 8, the number of the shown input terminal pads 26 is reduced.

By depositing dummy pattern regions (dummy patterns A and B) on the periphery of the input terminal pads 26, the surface level of the third interlayer insulation film 13 formed on the input terminal pads 26 is not raised alone but substantially equal to that of the pixel region 20; hence the initial polishing rate is reduced in the region of the input terminal pads 26 in the polishing process, the input terminal pads 26 are prevented from polishing, and thinning of the third interlayer insulation film 13 can be achieved. If a dummy pattern region is continuously formed around the input terminal pads 26, short-circuiting between input terminal pads 26 will occur through the conductive particles 38a and the dummy pattern after thermocompression bonding of the anisotropic conductive film 38.

In contrast, in this embodiment, no dummy pattern is provided between the input terminal pads 26, hence a non-dummy pattern E is provided, and the input terminal pads 26 are surrounded by divisional dummy patterns $S_1$ to $S_2$ to prevent short-circuiting between the input terminal pads 26. The distances between the input terminal pads 26 and the divisional dummy patterns $S_0$ to $S_2$ and between the individual divisional dummy patterns $S_0$ to $S_2$ are wider than the distance (approximately 5 µm) between the wiring L and the dummy pattern $S_3$ in order to prevent short-circuiting through the anisotropic conductive film 38.

In order to further suppress the prominence of the third interlayer insulation film 13 in the region of the input terminal pads 26 immediately after the film deposition, a dummy pattern may be formed between the input terminal pads 26, and the dummy pattern between the input terminal pads 26 is also divided into divisional dummy patterns to prevent short-circuiting between the input terminal pads 26. As the number of the divisional dummy patterns increases, the possibility of short-circuiting decreases; however, as the number increases, the surface prominence of the third interlayer insulation film 13 in the dummy pattern region is significant immediately after the film deposition. Accordingly, a moderate number is preferably selected. The planar shapes of these divisional dummy patterns are not limited to rectangular shapes (including square shapes), and a variety of shapes (triangular, polygonal, and curved) can be selected. For example, hexagonal divisional dummy patterns may be arranged to form a honeycomb shape.

FIG. 9 is a partial plan view of the periphery of the relay terminal pad 29R. The relay terminal pad 29R (29L) is a rectangular pad connected to the wiring L (for supplying a standard voltage for reversion of the polarity of the input voltage for alternate current drive of the liquid crystal) from the outermost terminal pad 26 beside the data line driver circuit 21, and is connected to the counter electrode 33 of the glass substrate 35 with a silver paste. The relay terminal pad 29R (29L) is surrounded by the dummy patterns $N_R$ and $N_L$. As a result, the surface level of the third interlayer insulation film 13 is uniform immediately after the film deposition as in the terminal pads 26.

In this embodiment, the distance between the relay terminal pad 29R and the dummy pattern $N_R$ is set to, for example, $70 \mu$ in order to prevent short-circuiting even when the applied silver paste slightly protrudes. That is, the distance between the relay terminal pad 29R and the dummy pattern $N_R$ is wider than that between the wiring and the nearest dummy pattern. The dummy pattern surrounding the relay terminal pad 29R may be a divisional dummy pattern.

Figure 24:
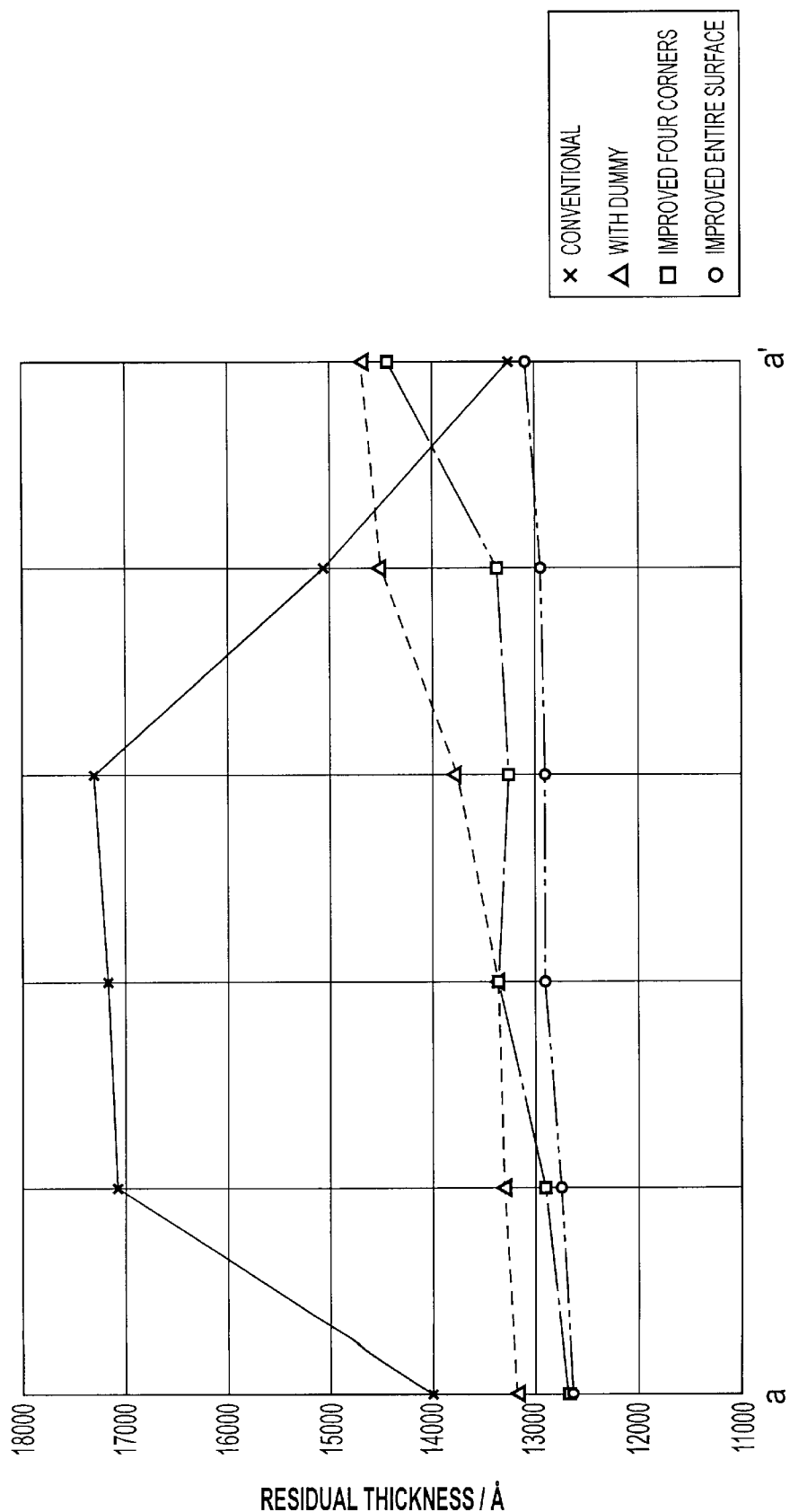
FIG. 24 is a graph of residual film thickness distributions in the vertical direction of the left side of the seal taken along the line a–a' in the conventional embodiment in FIG. 23, Embodiment 1 in FIG. 10, Embodiment 2 in FIG. 13 and Embodiment 3 in FIG. 16.
Figure 25:
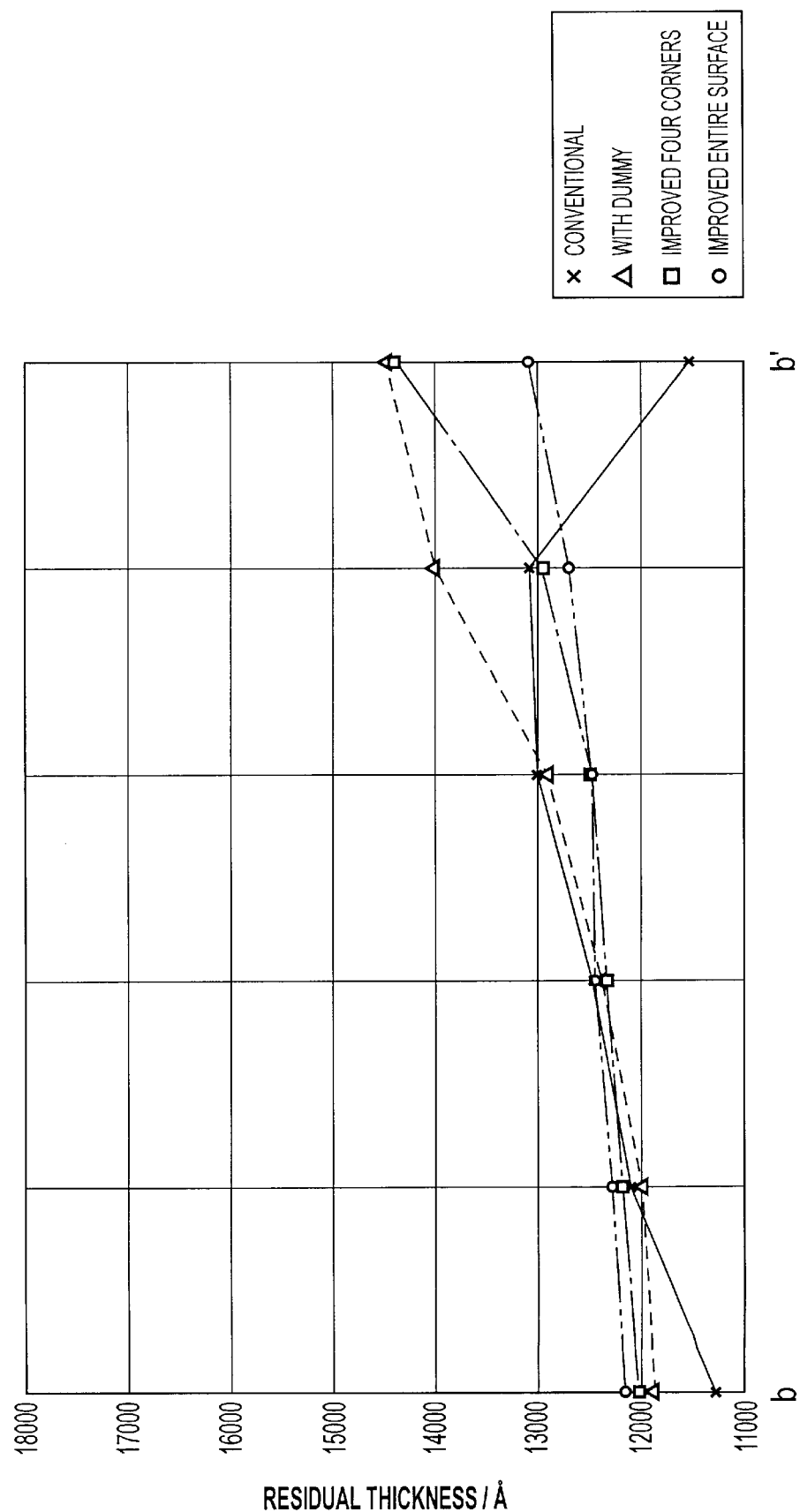
FIG. 25 is a graph of residual film thickness distributions in the vertical direction of the pixel center taken along the line b–b' in the conventional embodiment in FIG. 23, Embodiment 1 in FIG. 10, Embodiment 2 in FIG. 13 and Embodiment 3 in FIG. 16.
Figure 26:
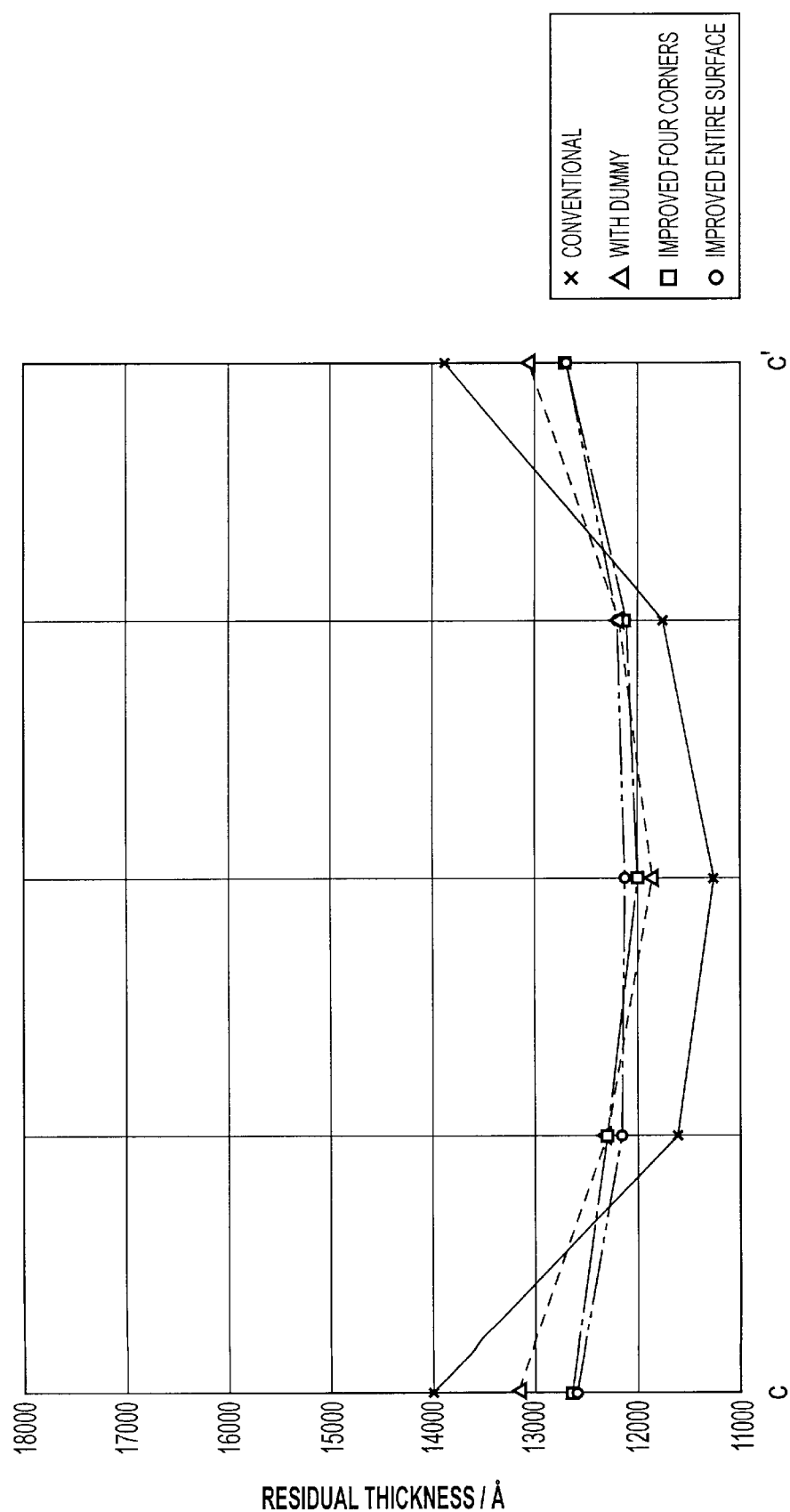
FIG. 26 is a graph of residual film thickness distributions in the transverse direction of the upper side of the seal taken along the line c–c' in the conventional embodiment in FIG. 23, Embodiment 1 in FIG. 10, Embodiment 2 in FIG. 13 and Embodiment 3 in FIG. 16.
Figure 27:
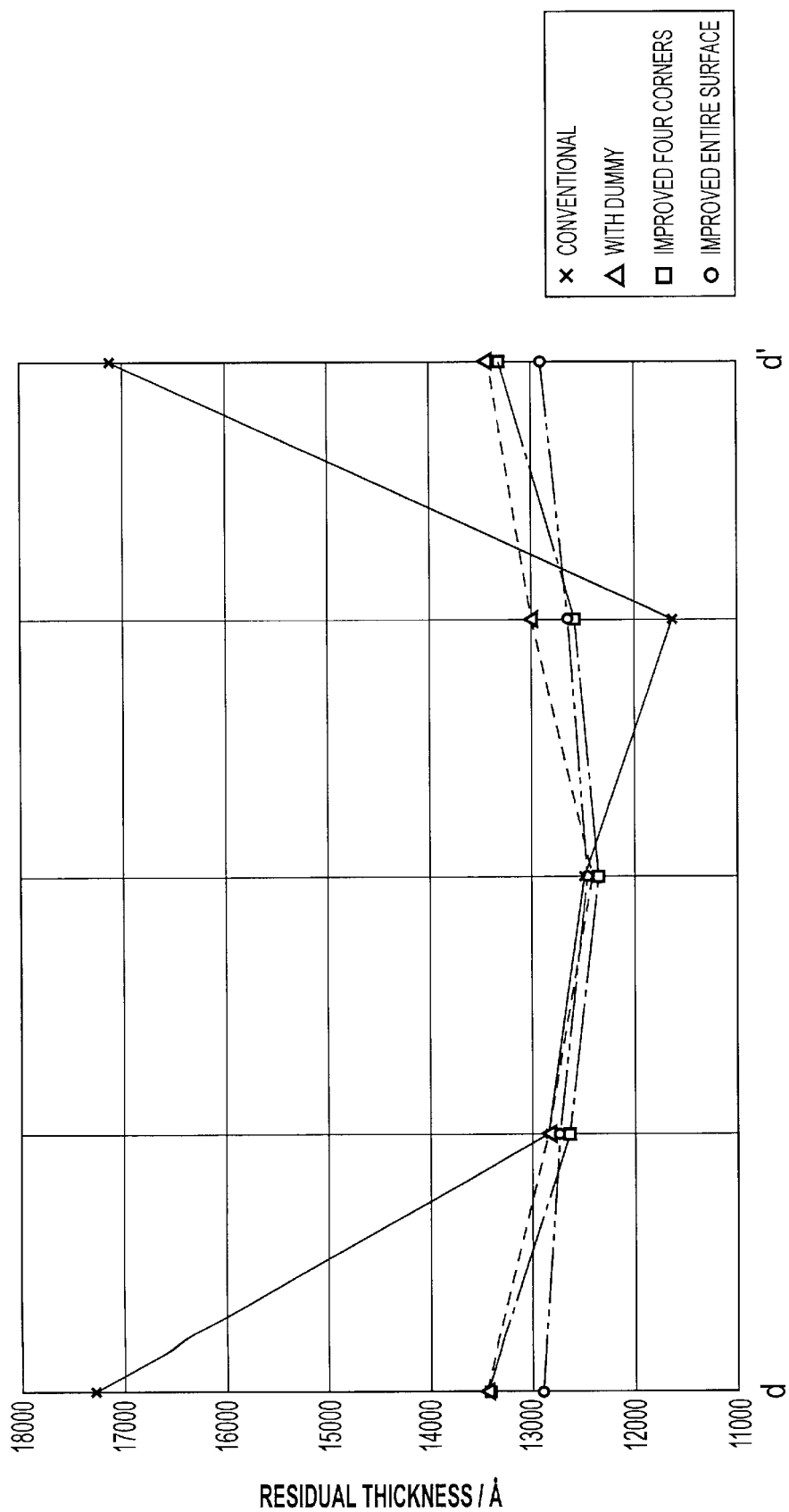
FIG. 27 is a graph of residual film thickness distributions in the transverse direction of the pixel center taken along the line d–d' in the conventional embodiment in FIG. 23, Embodiment 1 in FIG. 10, Embodiment 2 in FIG. 13 and Embodiment 3 in FIG. 16.
Figure 28:
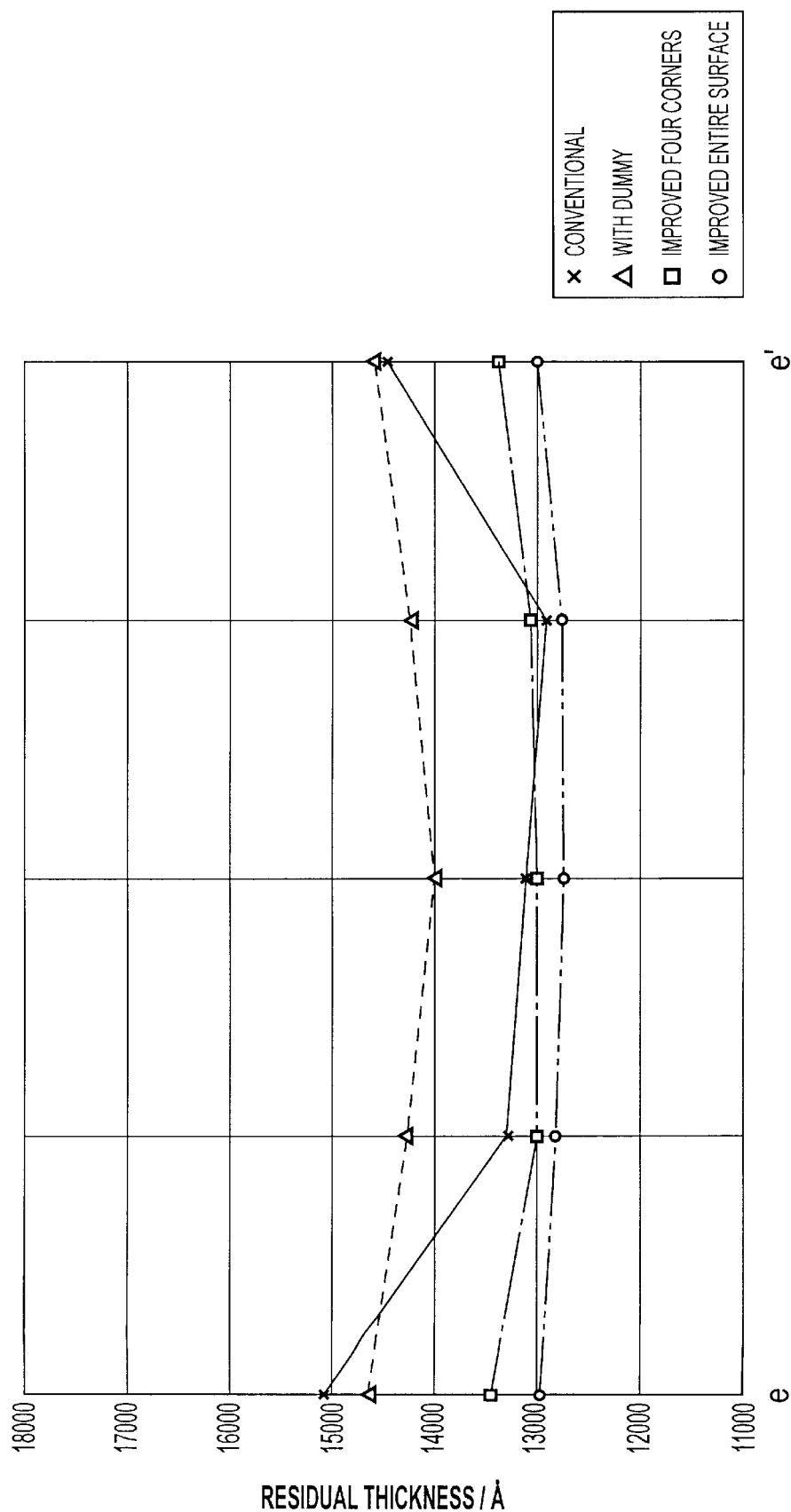
FIG. 28 is a graph of residual film thickness distributions in the transverse direction of the pixel center taken along the line e–e' in the conventional embodiment in FIG. 23, Embodiment 1 in FIG. 10, Embodiment 2 in FIG. 13 and Embodiment 3 in FIG. 16.

FIG. 10 is a contour plot of film illustrating the thickness distribution of the third interlayer insulation film 13 after polishing of the liquid crystal panel substrate 131 in accordance with Embodiment 1, in which the third interlayer insulation film 13 with a thickness of approximately 24,000 Å is formed and then subjected to the CMP treatment until the residual thickness of the third interlayer insulation film 13 reaches approximately 12,000 Å in the center of the pixel region 20. In FIG. 24, a graph depicted by marks Δ shows the residual thickness distribution of the left seal in the vertical direction taken along line a–a' of FIG. 10. In FIG. 25, a graph depicted by marks Δ shows the residual thickness distribution of the central pixel in the vertical direction taken along line b–b' of FIG. 10. In FIG. 26, a graph depicted by marks Δ shows the residual thickness distribution of the upper seal in the transverse direction taken along line c–c' of FIG. 10. In FIG. 27, a graph depicted by marks Δ shows the residual thickness distribution of the central pixel in the transverse direction taken along line d–d' of FIG. 10. In FIG. 28, a graph depicted by marks Δ shows the residual thickness distribution of the lower sealing region in the transverse direction taken along line e–e' of FIG. 10.

Figure 23:
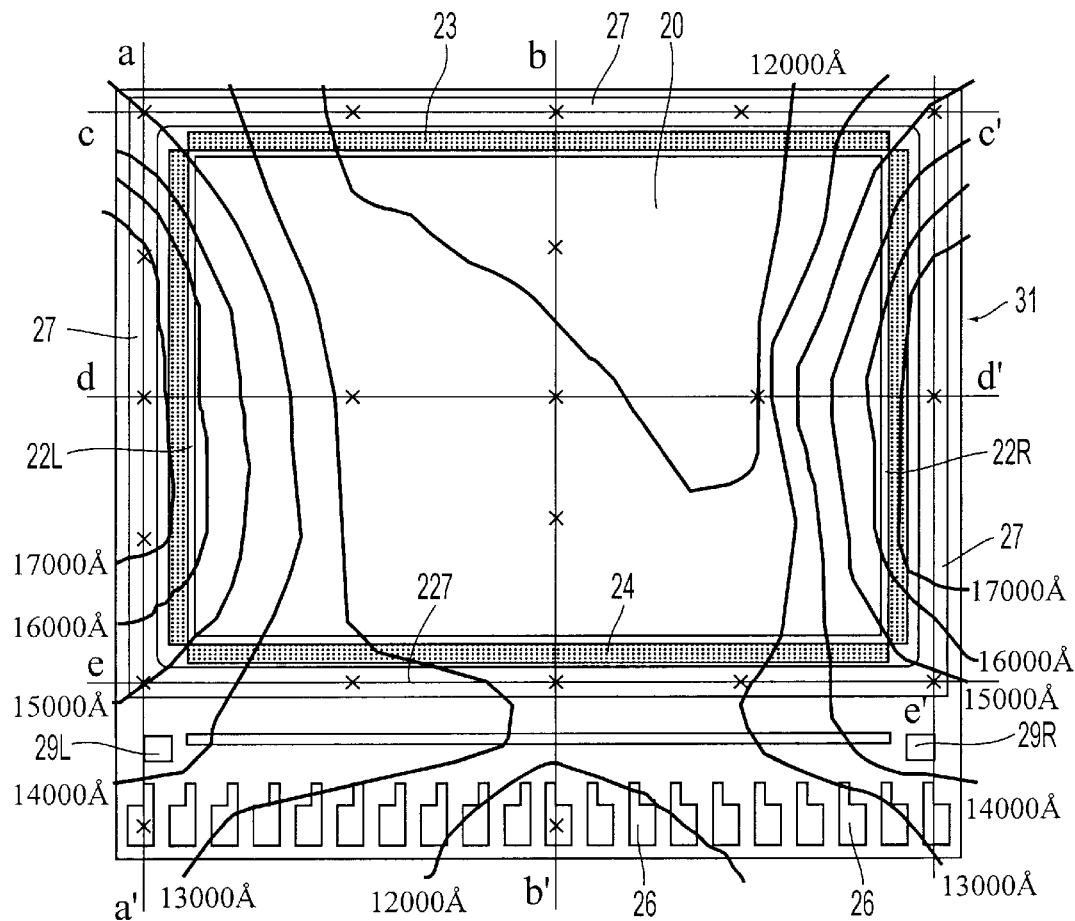
FIG. 23 is a contour plot of film illustrating the thickness distribution of the third interlayer insulation film after polishing of the conventional reflective liquid crystal panel substrate shown in FIG. 19, in which the third interlayer insulation film with a thickness of approximately 24,000 Å is formed and then subjected to the CMP treatment until the residual thickness of the third interlayer insulation film reaches approximately 12,000 Å in the center of the pixel region.

These graphs demonstrate that the maximum difference in the thickness between the pixel region 20 and the sealing region 127 is 2,720 Å, and the distance between the contour lines (corresponding to a difference of 1,000 Å in the thickness) is considerably larger than that in FIG. 23. The flatness of the pixel region 20 is improved by a factor of two or more.

The maximum difference in the thickness is reduced to approximately 2,910 Å over the entire substrate (chip). The slope of the indented central portion of the top side of the sealing region 127 is reduced to approximately one-half or less, and the slope of the indented central portion of the bottom side of the sealing region 127 is reduced to approximately one quarter or less. The right and left sides of the sealing region 127 have minimum thicknesses at the top corners, hence the central protrusion is prevented, and the slope is reduced to one quarter or less. Wide continuous dummy pattern regions (dummy patterns A and B) cause such significant improvement in almost the entire exterior of the pixel region 20 and the peripheral circuit region.

It is preferable that the maximum difference in the thickness be reduced to 1,000 Å or less in the pixel region 20. In the thickness distribution of the pixel region 20, the vertical line in the pixel center corresponds to the trough line of the thickness, and the central region of the input terminal pads 26 corresponds to the maximum thickness (approximately 14,500 Å). This suggests insufficient polishing in the region of the input terminal pads 26 in contrast to the conventional one in FIG. 23.

Figure 11:
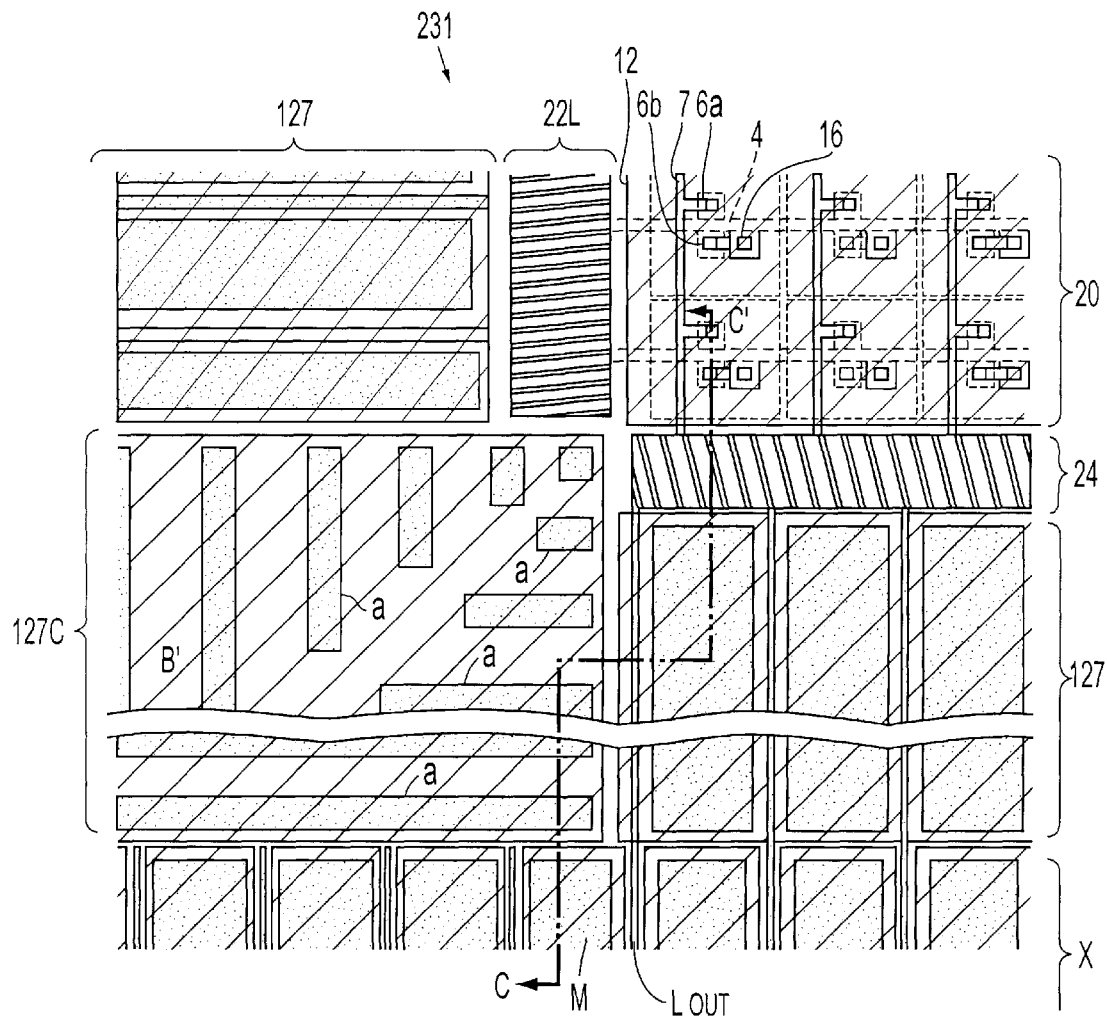
FIG. 11 is a partial plan view of the four-corner portion of the sealing region in a reflective liquid crystal panel substrate in accordance with Embodiment 2 of the present invention.
Figure 12:
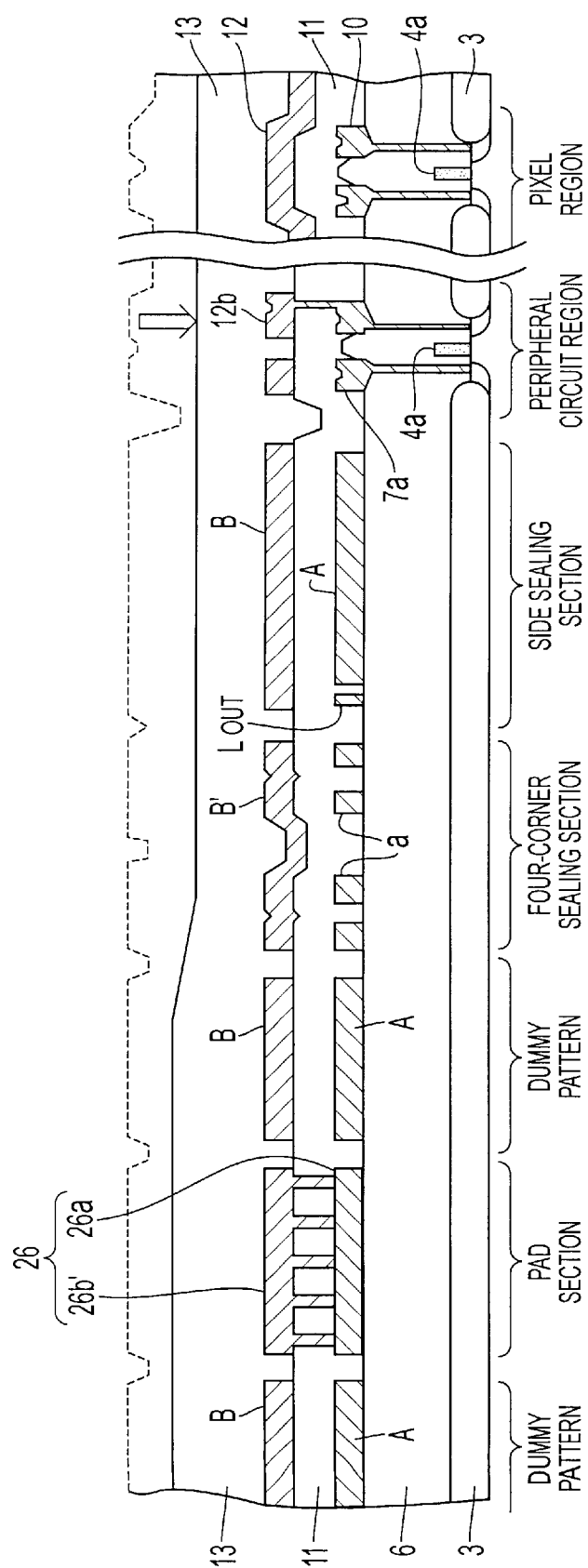
FIG. 12 is a cross-sectional view taken along the line C–C' in FIG. 11.

FIG. 11 is a partial plan view of the four-corner portion of the sealing region in a reflective liquid crystal panel substrate in accordance with Embodiment 2 of the present invention. FIG. 12 is a cross-sectional view taken along the line C–C' in FIG. 11. In FIG. 11, regions with dotted patterns represent the first metal layer and regions with hatching represent the second metal layer, whereas the third metal layer is not shown. The configurations other than that described below are the same as those of the reflective liquid crystal panel substrate in accordance with Embodiment 1.

The reflective liquid crystal panel substrate 231 has substantially the same configuration as that of the reflective liquid crystal panel substrate 131 in accordance with Embodiment 1. The pixel region 20 is surrounded by the sealing region 127 of isolated wide continuous dummy pattern regions (the dummy pattern A of the first metal layer and the dummy pattern B of the second metal layer). The input terminal pads 26, the relay terminal pads 29R and 29L and the data line driver circuit 21 are also surrounded by wide continuous dummy pattern regions (the dummy pattern A of the first metal layer and the dummy pattern B of the second metal layer). Differing from the wide continuous dummy patterns, such as the dummy patterns A lying between the wirings $L_{OUT}$ at the sealing side in Embodiment 1, in a rectangular region at the four-corner sealing portion 127C of the sealing region 127, the dummy pattern of the first metal layer forms a group including a plurality of independent divisional patterns. In detail, a plurality of rectangular divisional patterns a each having a different area are separately arranged in the vertical and transverse directions, and have a pattern density of 50% or less. The divisional patterns a have different areas from each other which are smaller than that of the input terminal pads 26. The dummy pattern B' of the second metal layer at the four-corner sealing portion 127C has a rectangular wide continuous surface. As a result, as shown by the dotted line in FIG. 12 the unpolished surface of the third interlayer insulation film 13 at the four-corner sealing portion 127C has roughness which reflects the unevenness of the divisional dummy patterns a.

In CMP treatment of the surface of the third interlayer insulation film 13 on the substrate provided with divisional dummy patterns a with a low density distribution at the four-corner sealing portion 127C, the four-corner sealing portion 127C has a higher initial polishing rate than that at the gentle bump side of the sealing region 127. Hence the polishing rate of the sealing region 127 surrounded by four units at the four-corner sealing portion 127C are equalized to that of the interior region during polishing, and the difference in the residual thickness between the pixel region 20 and the sealing region 127 is suppressed. In particular, it is important to impart in advance roughness to the right and left corners of the bottom side of the sealing region 127 among the corner portion 127C of the four units.

When the divisional dummy patterns a have substantially the same area and are distributed uniformly or randomly at the four-corner sealing portion 127C, a decreased pattern density (a decreased ratio of the total dummy pattern area per unit area) causes larger distances between the dummy patterns a and thus the dummy patterns a have a small distribution density. As a result, the initial polishing rate of the third interlayer insulation film 13 is higher than that of the periphery of the four-corner sealing portion 127C, a slanted surface is first formed at the periphery of the four-corner sealing portion 127C, and the slanted surface gradually spreads towards the inside during polishing. When the pattern density is the same, when the number of the divisional dummy patterns a is reduced and when the area of the divisional dummy patterns a is increased, these are prominent and have larger initial polishing rates. The boundary of the four-corner sealing portion 127C rapidly forms a slanted surface, and the slanted surface gradually spreads towards the inside during polishing as in the above case. Since a dummy pattern distribution for causing the initial polishing rate of the four-corner sealing portion 127C to increase compared with its periphery is provided in this embodiment, the residual thickness is affected by the residual thickness of the four-corner sealing portion 127C as a standard thickness, and thus can be easily equalized at the periphery of the sealing region 127 surrounded by the four-corner sealing portion 127C of the four units and the pixel region 20. Accordingly, the sealing region 127 and the pixel region 20 are flattened or planarized.

As shown in FIG. 11, in the four-corner sealing portion 127C, a plurality of rectangular divisional dummy patterns a are arranged in the vertical direction at the right and left sides of the sealing region, and a plurality of rectangular divisional dummy patterns a are arranged in the transverse direction at the top and bottom sides of the sealing region. It is considered that each vertical rectangular divisional dummy pattern a having the highest initial polishing rate at the longitudinal (vertical) sides contributes to the planarization of the vertical direction of the sealing region, whereas each transverse rectangular divisional dummy pattern a having the highest initial polishing rate at the longitudinal (transverse) sides contributes to the planarization of the transverse direction of the sealing region. In this embodiment, the vertical rectangular divisional dummy patterns a are not arranged near the top and bottom sides of the sealing portion and the transverse rectangular divisional dummy patterns a are not arranged near the right and left sides of the sealing portion. Instead, the vertical rectangular divisional dummy patterns a are arranged near the right and left sides of the sealing portion, and the transverse rectangular divisional dummy patterns a are arranged near the top and bottom sides of the sealing portion. As a result, a high initial polishing rate at the four-corner sealing portion 127C is achieved by the high initial polishing rates of these dummy patterns in the vertical and transverse directions.

Modification of the shapes, array and pattern density of the divisional dummy patterns a will further improve planarization of the sealing region 127 and the inner region.

When the four-corner sealing portion 127C has no dummy pattern (a pattern density of zero), the boundary is easily polished to form a slanted surface at the initial stage of the polishing, since the corner is indented from its periphery and the boundary portion protrudes. The slanted surface gradually spreads towards the inner region. As a result, the pixel region 20 and the sealing region are totally flattened or planarized.

Figure 13:
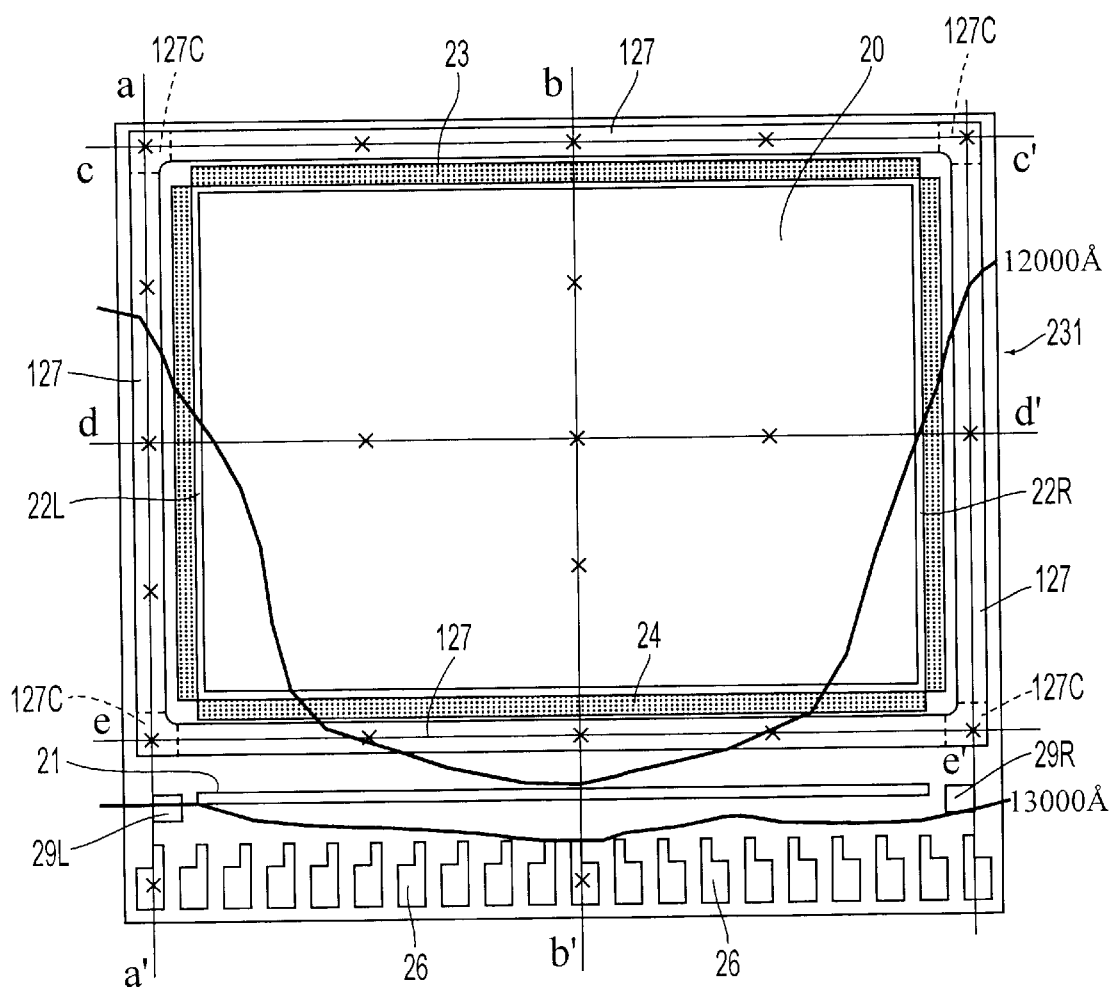
FIG. 13 is a contour plot of film illustrating the thickness distribution of the third interlayer insulation film after polishing of the liquid crystal panel substrate in accordance with Embodiment 2, in which the third interlayer insulation film with a thickness of approximately 24,000 Å is formed and then subjected to the CMP treatment until the residual thickness of the third interlayer insulation film reaches approximately 12,000 Å in the center of the pixel region.

FIG. 13 is a contour plot of film illustrating the thickness distribution of the third interlayer insulation film 13 after polishing of the liquid crystal panel substrate 231 in accordance with Embodiment 2, in which the third interlayer insulation film 13 with a thickness of approximately 24,000 Å is formed and then subjected to the CMP treatment until the residual thickness of the third interlayer insulation film 13 reaches approximately 12,000 Å in the center of the pixel region 20. In FIG. 24, a graph depicted by marks □ shows the residual thickness distribution of the left seal in the vertical direction taken along line a–a' of FIG. 13. In FIG. 25, a graph depicted by marks □ shows the residual thickness distribution of the central pixel in the vertical direction taken along line b–b' of FIG. 13. In FIG. 26, a graph depicted by marks □ shows the residual thickness distribution of the upper seal in the transverse direction taken along line c–c' of FIG. 13. In FIG. 27, a graph depicted by marks □ shows the residual thickness distribution of the central pixel in the transverse direction taken along line d–d' of FIG. 13. In FIG. 28, a graph depicted by marks □ shows the residual thickness distribution of the lower sealing region in the transverse direction taken along line e–e' of FIG. 13.

These graphs demonstrate that the maximum difference in thickness between the pixel region 20 and the sealing region 127 is 1,380 Å, and the distance between the contour lines (corresponding to a difference of 1,000 Å in thickness) is larger than that in FIG. 10. The flatness of the pixel region 20 is improved by a factor of two or more compared with Embodiment 1. The maximum difference in the thickness is approximately 2,500 Å over the entire substrate (chip), since the region of the input terminal pads 26 including wide continuous dummy patterns is insufficiently polished and still has large thickness. The slope of the indented central portion of the top side of the sealing region 127 is reduced to approximately one-half or less compared with that in Embodiment 1. The right and left sides of the sealing region 127 are substantially flattened because dummy patterns with a low pattern density at the bottom right and left corners of the sealing region 127 prompt polishing.

As shown in FIG. 13, however, the sealing region still has a large thickness on the periphery of the bottom right and left corners, hence the maximum difference in the thickness in the pixel region 20 and the sealing region 127 is not smaller than 100 Å. When the four-corner sealing portion 127C has no dummy pattern a (a pattern density of zero), the inner pixel region 20 is further flattened or planarized, but the boundary of the four-corner sealing portion 127C could have a steep slope. Dummy patterns a may be formed such that the pattern density decreases from the bottom right and left corners 127C to the upper positions of the right and left sides, or to the central portion of the bottom side. In such a case, the pixel region 20 and the sealing region 127 can be further flattened or planarized.

Figure 14:
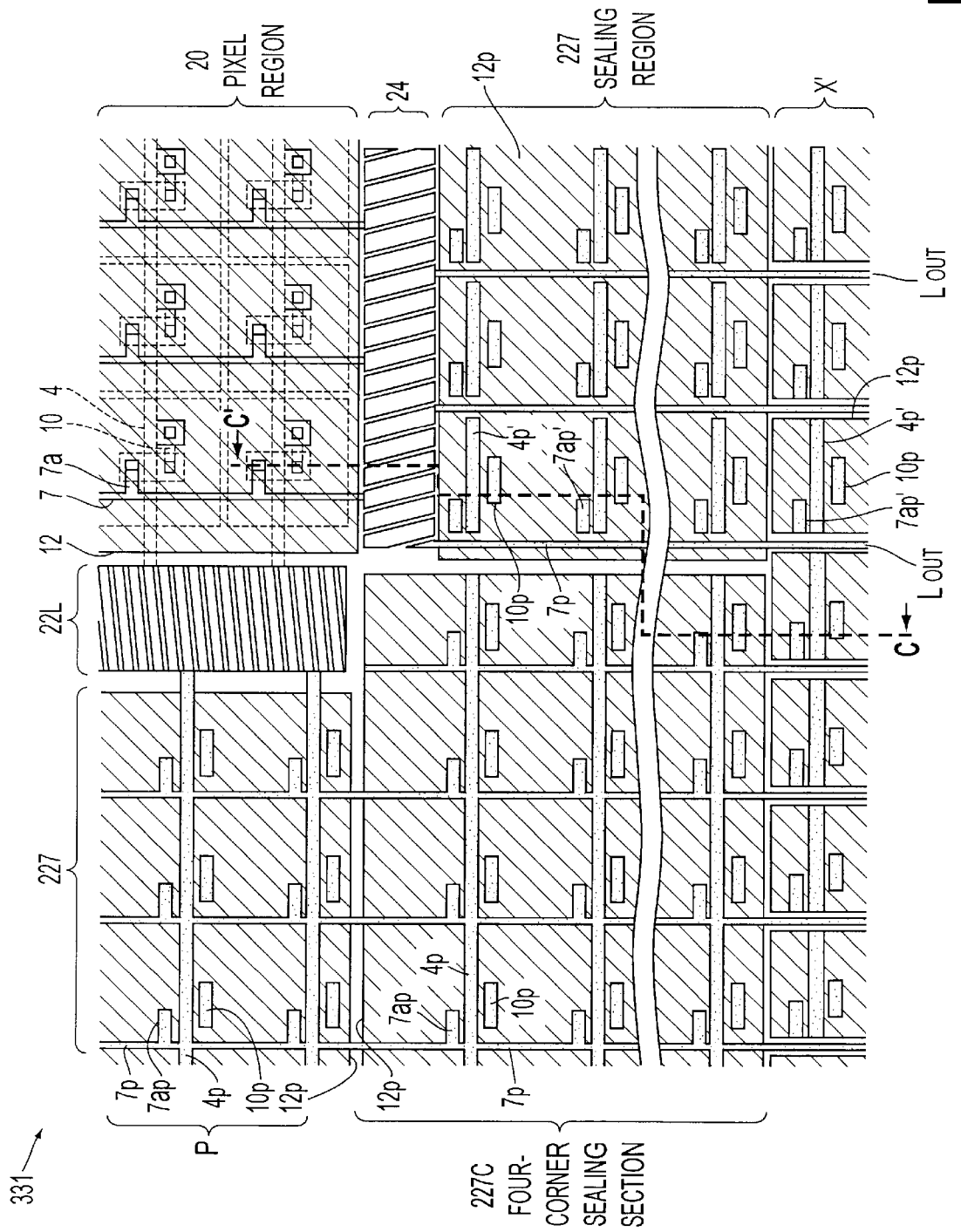
FIG. 14 is a partial plan view of the four-corner portion of the sealing region in a reflective liquid crystal panel substrate in accordance with Embodiment 3 of the present invention.
Figure 15:
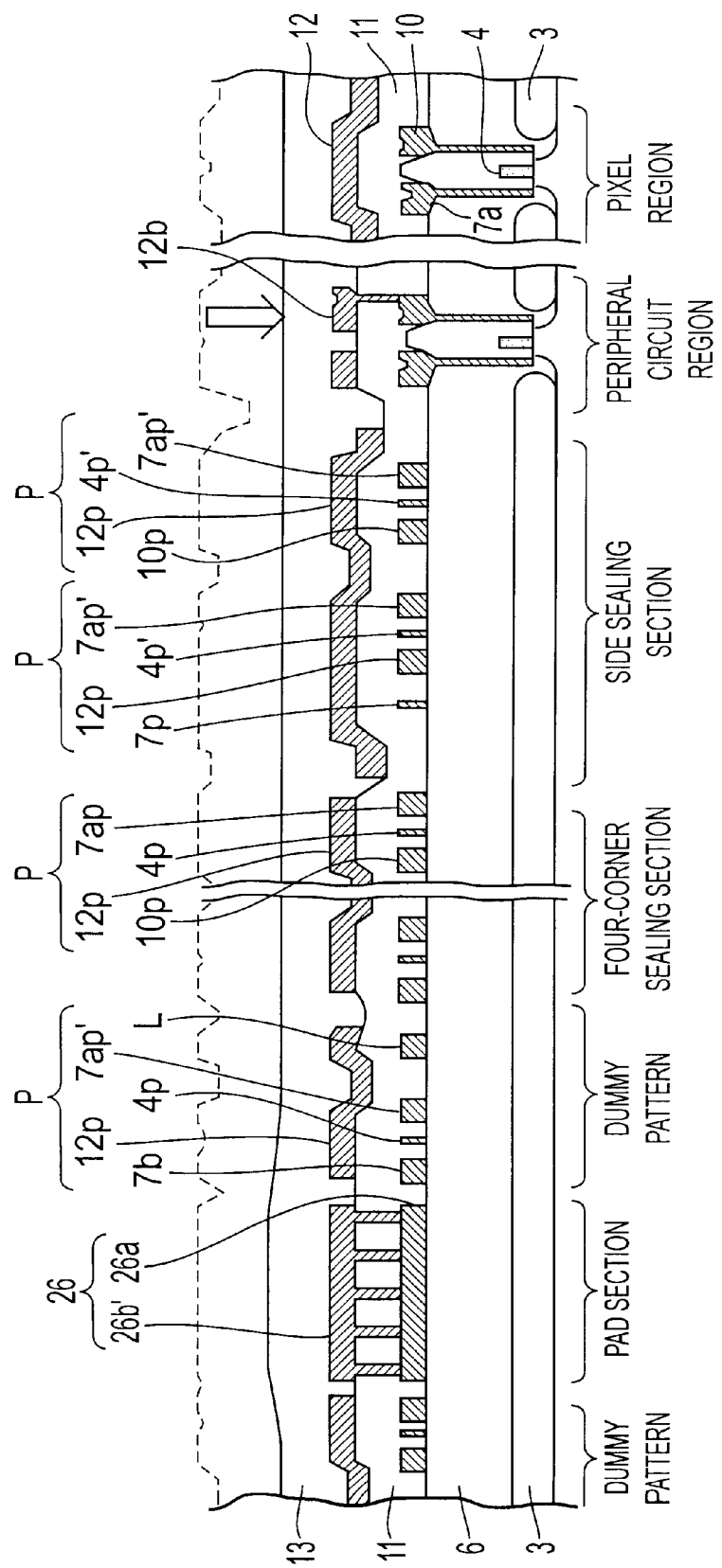
FIG. 15 is a cross-sectional view taken along the line C–C' in FIG. 14.

FIG. 14 is a partial plan view of the four-corner portion of the sealing region in a reflective liquid crystal panel substrate in accordance with Embodiment 3 of the present invention. FIG. 15 is a cross-sectional view taken along the line C–C' in FIG. 14. In FIG. 14, regions with dotted patterns represent the first metal layer and regions with hatching represent the second metal layer, whereas the third metal layer is not shown. The configurations other than that described below are the same as those of the reflective liquid crystal panel substrate in accordance with Embodiment 1.

The reflective liquid crystal panel substrate 331 in this embodiment has uneven pseudo pixel patterns P as a matrix of dummy patterns (two-dimensionally repeated pattern) lying over the sealing region 227 surrounding the pixel region 20 and its outer region. The uneven pseudo pixel patterns P vertically and horizontally extend to the peripheries of the data line driver circuit 21, the relay terminal pads 29R and 29L, and the input terminal pads 26. Each uneven pseudo pixel pattern P produces a uneven pattern, which resembles the pixel pattern and has a volume similar to that of each pixel in the pixel region 20, on the third interlayer insulation film 13.

In this embodiment, each uneven pseudo pixel pattern includes pseudo gate lines $4_P$ of the first metal layer having substantially the same width as that of the gate lines 4 lying on the bottommost layer of the pixel; data lines 7 of the first metal layer of the pixel; pseudo data lines $7_P$ of the first metal layer having substantially the same width as that of the source electrode wirings 7a and the relay wirings 10; pseudo source electrode wirings $7a_P$; pseudo relay wiring $10_P$; and wide pseudo shading films $12_P$ of the second metal layer imitating the shading film 12 of the second metal layer in the pixel portion. The pattern density of the bottom layer wirings and the first metal layer is approximately 25% in each pixel, hence the pattern density of the uneven pseudo pixel patterns P composed of the first metal and second metal layers is set to substantially the same value.

At the periphery of the upper and lower sealing regions (sides) 227 and the boundary region X', the signal wiring $L_{OUT}$ of the first metal layer from the data line driver circuit 21 to the pixel signal sampling circuit 24 is used as the pseudo data line $7_P$. The pseudo gate line $4_P$' of the first metal layer and the pseudo source electrode wiring $7a_P$' are not connected to the pseudo data line $7_P$.

The uneven pseudo pixel patterns P are vertically and horizontally repeated on the substrate, but the matrix of the uneven pseudo pixel patterns P is slightly different from the matrix of the pixel region 20 in this embodiment. The matrices of the uneven pseudo pixel patterns P and the pixel region 20 can be unified by changing the layout of the devices in the peripheral circuit region, such as the data line driver circuit 21, pixel signal sampling circuit 24, and the gate line driver circuits 22R and 22L, and the layout of the signal wirings $L_{OUT}$.

On the substrate 331 provided with the uneven pseudo pixel patterns P, uneven surface patterns like the uneven pixel patterns are periodically arranged over the surface of a region of the third interlayer insulation film 13 before CMP treatment other than the pixel region 20. Accordingly, the polishing rate is made uniform over the entire substrate 331 from the initial polishing stage and at least the pixel region 20 and the sealing region 227 can be flattened or planarized with high accuracy.

Figure 16:
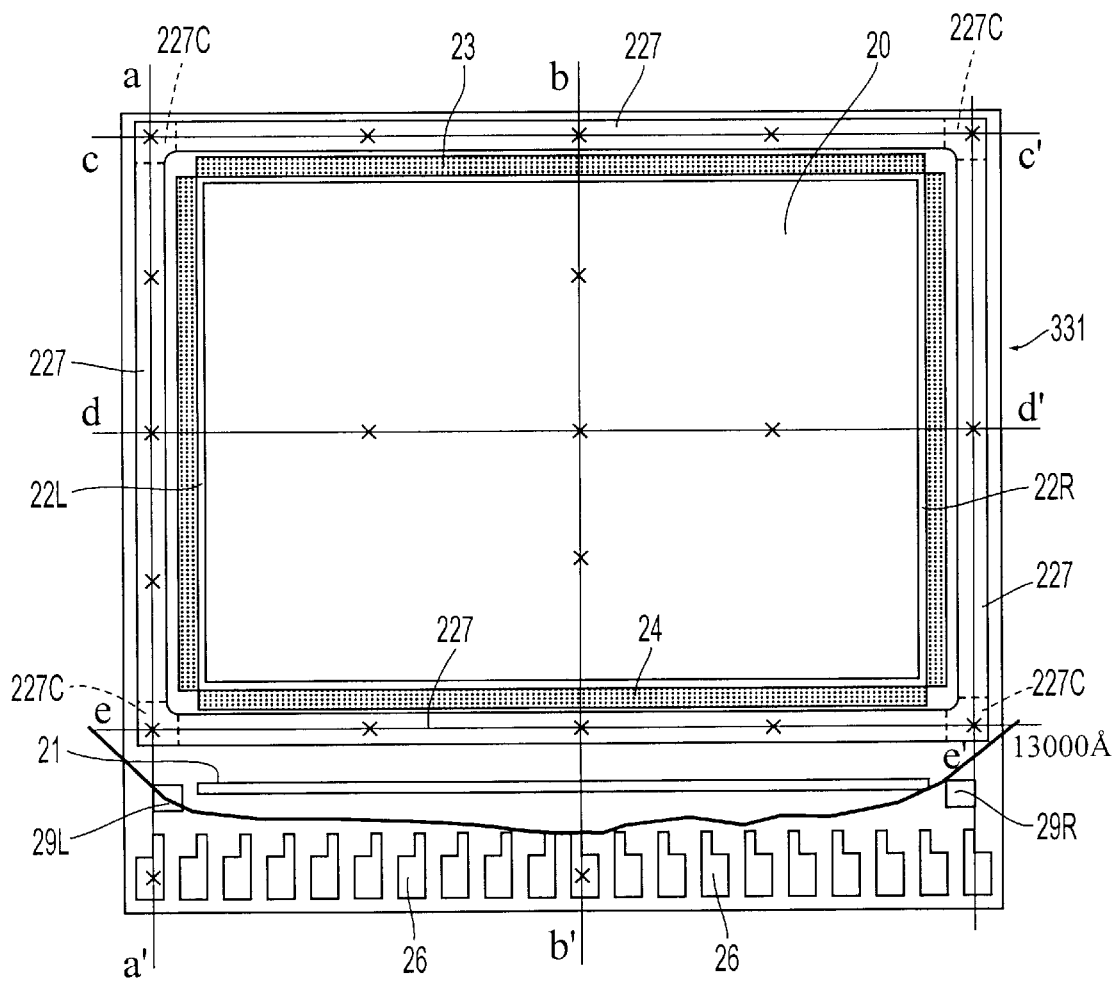
FIG. 16 is a contour plot of film illustrating the thickness distribution of the third interlayer insulation film after polishing of the liquid crystal panel substrate in accordance with Embodiment 3, in which the third interlayer insulation film with a thickness of approximately 24,000 Å is formed and then subjected to the CMP treatment until the residual thickness of the third interlayer insulation film reaches approximately 12,000 Å in the center of the pixel region.
Figure 17:
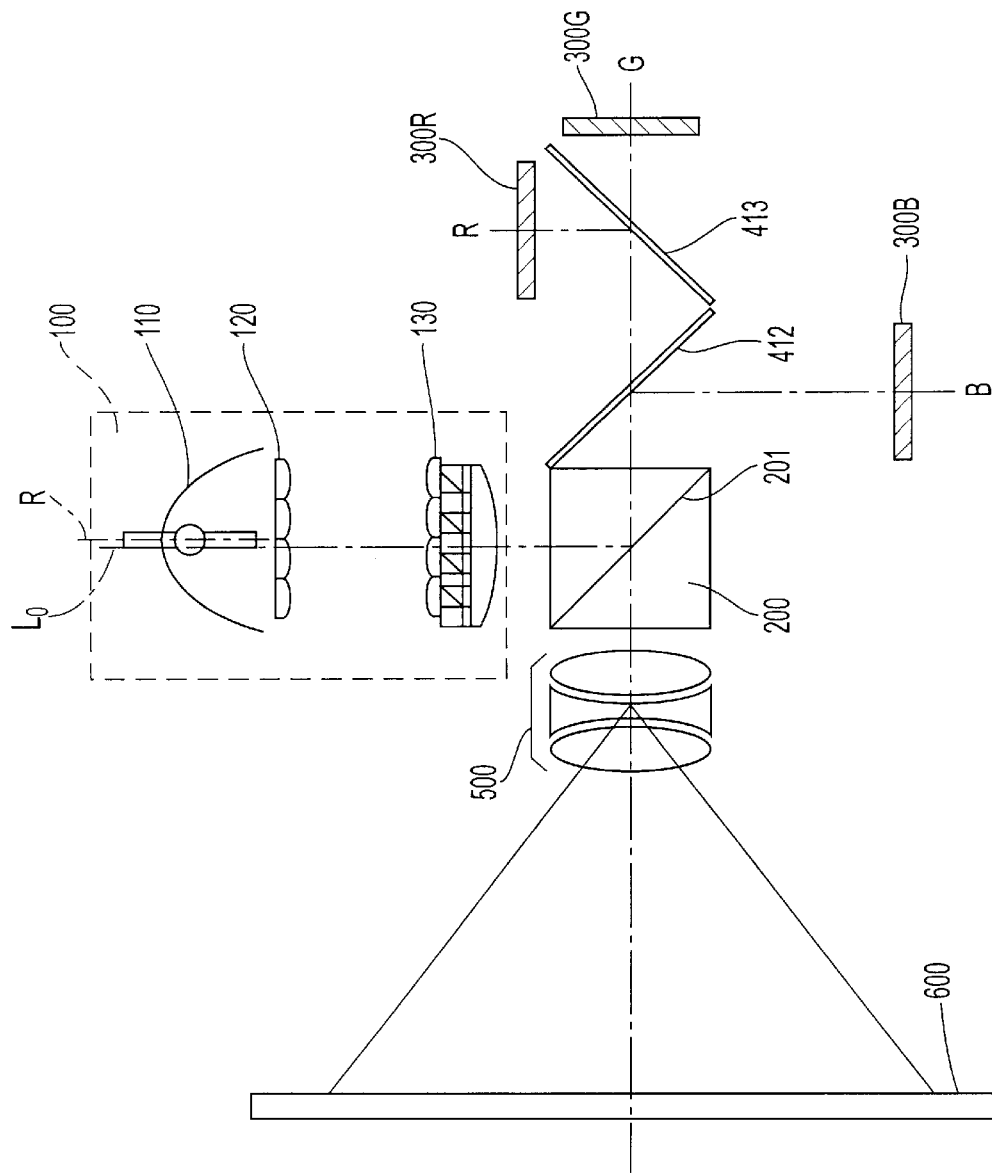
FIG. 17 is a schematic diagram of a video projector as an example of a projection display device using a reflective liquid crystal panel as a light valve.

FIG. 16 is a contour plot of film illustrating the thickness distribution of the third interlayer insulation film 13 after polishing of the liquid crystal panel substrate 331 in accordance with Embodiment 3, in which the third interlayer insulation film 13 with a thickness of approximately 24,000 Å is formed and then subjected to the CMP treatment until the residual thickness of the third interlayer insulation film 13 reaches approximately 12,000 Å in the center of the pixel region 20. In FIG. 24, a graph depicted by marks ○ shows the residual thickness distribution of the left seal in the vertical direction taken along line a–a' of FIG. 16. In FIG. 25, a graph depicted by marks ○ shows the residual thickness distribution of the central pixel in the vertical direction taken along line b–b' of FIG. 16. In FIG. 26, a graph depicted by marks ○ shows the residual thickness distribution of the upper seal in the transverse direction taken along line c–c' of FIG. 16. In FIG. 27, a graph depicted by marks ○ shows the residual thickness distribution of the central pixel in the transverse direction taken along line d–d' of FIG. 16. In FIG. 28, a graph depicted by marks ○ shows the residual thickness distribution of the lower sealing region in the transverse direction taken along line e–e' of FIG. 16.

These graphs demonstrate that the maximum difference in the thickness between the pixel region 20 and the sealing region 127 (including the four-corner sealing portion 227C) is approximately 850 Å, and the maximum difference in the thickness over the entire substrate is approximately 950 Å. The pixel region 20 and the sealing region 227 are satisfactorily flattened. Although the peripheral region of the input terminal pads 26 shows slightly insufficient polishing, the region will be further flattened by reducing the pattern density of the uneven pseudo pixel patterns P.

The elements forming the uneven surface pattern on the pixel region include the two openings provided in the field oxide film, the gate lines 4 of the bottom layer, the data lines 7 of the first metal layer, the source electrode wirings 7a, the relay electrodes 10, the shading film 12 of the second metal layer, and the plug hole 12a. In this embodiment, although the pseudo gate line $4_P$ of the first metal layer imitates the gate line 4 of the bottom layer, the pseudo gate line $4_P$ may be formed of the bottom wiring layer. Further, each segment of the uneven pseudo pixel pattern P may include pseudo openings imitating the two openings provided in the field oxide film 3 and a pseudo plug hole imitating the plug hole 12a. Uneven pseudo pixel patterns significantly resembling the pixel pattern can be formed on the periphery of the pixel region 20 by the same process without additional steps, and the pixel region 20 and the sealing region 227 can be further flattened.

At the initial stage in the CMP treatment, a dense protruded portion of the surface is polished with difficulty, while a sparsely protruded portion is polished with ease, since isolated protrusions are rapidly polished. When there are two regions, that is, a dense region in which dense protrusions are distributed at random, and a sparse region in which sparse protrusions are distributed at random, both protrusions having substantially the same size, the sparse region has a higher initial polishing rate, hence a slanted surface will be formed over these regions after polishing. The sparse region has a low pattern density as a result. On the other hand, the protrusion (islands) with a small surface area has a higher initial polishing rate, whenever the surface to be polished has a uniform pattern density, because the perimeter of the island is long relative to the area of the island. A region in which protrusions with a large area are densely distributed at random is polished with most difficulty at the initial polishing stage. A representative example is a wide continuous pattern covering the entire range. In contrast, a region in which protrusions with small areas are sparsely distributed at random can be easily polished at the initial polishing stage. A representative example is a region having no protrusions (no dummy pattern). It is presumed that a region in which protrusions with large areas are sparsely distributed at random and a region in which protrusions with small areas are densely distributed at random have mediate polishing rates between the maximum rate and the maximum rate at the initial polishing stage; however, it is not known which has a higher initial polishing rate because the polishing rate depends on the polishing solution and other parameters including the regularity of distribution, and the shape, arrangement, and position of the protrusions. The polishing solution probably has a regular flow distribution due to a regular bump distribution in the pixel region 20 during the CMP treatment; hence a means for achieving the similar flow distribution is required for the non-pixel regions.

Within the chip size of the reflective liquid crystal panel substrate, since the input terminal pads 26 are considered to be the largest protrusions and to be sparsely distributed in view of its one-dimensional array extension, the region including the input terminal pads 26 has the maximum polishing rate. The pixel region 20, however, has spatial periodicity in configuration of a matrix of uneven pixel patterns. As a result, the pixel region 20 has a hierarchic regularity including two different levels of regularity, that is, higher-order regularity of spatial periodicity in the uneven pixel patterns and lower-order regularity within a uneven pixel pattern. The uneven pixel pattern has a hierarchic structure comprising a distribution of various basic (primary), microscopic uneven sections represented by fine lines with a width of 1,000 Å to 10,000 Å (two openings in the field oxide film 3, the gate line 4 of the bottom wiring layer, the data line 7 of the first metal layer, the source electrode wiring 7a, the relay electrode wiring 10, and the shading film 12 and plug hole 12a of the second metal layer) and condensed uneven portions (second uneven portions) caused by the irregularity of the basic uneven portions in the pixel. The uneven pseudo pixel pattern P in this embodiment imitates a macroscopic condensed uneven portion including only the pseudo gate line $4_P$, the pseudo data line $7_P$, the pseudo source electrode $7a_P$, and the pseudo relay wiring $10_P$, instead of the basic uneven portion. The condensed uneven portion in this embodiment is considered to be an overlap portion of the gate line 4 and the data line 7 and an overlap portion of the capacitor electrode 9a and the relay wiring 10. Accordingly, the uneven pseudo pixel pattern P preferably includes the pseudo gate line $4_P$, the pseudo data line $7_P$ and the pseudo relay wiring $10_P$. A typical uneven portion may be used as an element of uneven pseudo pixel pattern P. It is not necessary that the position of a typical uneven portion in the uneven pseudo pixel pattern P exactly corresponds to the position of a typical uneven portion in the actual pixel.

Supposing that the uneven pixel pattern has a third or more hierarchic configuration, it is necessary that the basic uneven portion is exactly replicated and thus imitation of the second or third order uneven portion is sufficiently useful. When the hierarchic configuration in the uneven pixel pattern is not clarified, an uneven pseudo pixel pattern P being the exact replica of the basic uneven portion has an advantage, that is, a simplified mask design. For high accuracy planarization with a maximum difference in the thickness of less than 1,000 Å, it is preferable that the uneven pseudo pixel pattern P be the exact replica of the basic uneven portion.

The liquid crystal panel substrate in this embodiment is suitable for use in reflective liquid crystal panel, and is also applicable to light valves for liquid crystal projectors; portable information processing machines including wrist watch-type electronic devices, word processors, and personal computers; and displays for portable telephones and other electronic devices.

In the liquid crystal panel substrate in this embodiment, switching elements are fabricated on the main surface of a semiconductor substrate. Insulating substrates, such as glass substrates and quartz substrates, can also be used instead of semiconductor substrates. The present invention is also applicable to formation of thin film transistors (TFTs) on an insulating substrate as a switching device.

Further the present invention is applicable to flat display panel substrates other than liquid crystal panel substrates.

As described above, in the present invention no dummy pattern is formed in the unused space of the pixel region, and a dummy pattern for raising the level of the upper interlayer insulation film, which is subjected to polishing, is formed by using the conductive layer preformed in the entire non-pixel region. If a dummy pattern is formed in the pixel region, additional deposition steps for depositing a medial conductive layer and an interlayer insulation film are required for raising the level. When the surface bump of the interlayer insulation film before polishing is suppressed, the initial polishing rate undesirably decreases, mirror planarization of the interlayer insulation film requires a long polishing time and a large amount of polishing solution. The present invention can solve such problems and has the following advantages.

(1) When a dummy pattern of a single or plural layers is provided near the terminal pad, the surface level of the upper interlayer insulation film near the terminal pad is substantially equal to the surface level in the pixel region. Since the surface level is smoothed as a whole, a uniform polishing rate is achieved over the entire surface. Accordingly the present invention improves excessive polishing at the terminal pad portion, which has not been solved in conventional formed surfaces with nonuniform surface levels, and thus the underlying layer at the terminal pad portion is not exposed by polishing. Such an advantage is useful for mirror planarization of the surface in the pixel region, and thinning of the interlayer insulation film before polishing will be achieved. The thinning improves the aspect ratio of the contact hole of the conductive interlayer in the pixel region and thus can form an opening having a smaller diameter accompanied by the contact hole having a smaller diameter. The shading effect is therefore improved, resulting in an improvement in switching elements. Of course, no additional film deposition step is required.

When a conductive dummy pattern lies near the terminal pads outside the pixel region, the dummy pattern functions as a shading film, hence it prevents the invasion of stray light from the exterior of the pixel region into the pixel region on the substrate, resulting in a suppressed photocurrent flow and an improved switching element.

(2) When a dummy pattern arranged near the input terminal pads is divided into a plurality of divisional dummy patterns, a uniform surface level of the interlayer insulation film immediately after deposition is achieved and short-circuiting between the two adjacent input terminal pads can be prevented.

(3) When a non-dummy pattern region is provided between two adjacent input terminal pads, short-circuiting between the two adjacent input terminal pads can be securely prevented.

(4) When the distance between an input terminal pad and a divisional dummy pattern provided near the input terminal pad is larger than the distance between a wiring and a dummy pattern near the wiring, bridging by conductive particles in an anisotropic conductive film between the input terminal pad and the divisional dummy pattern will barely occur and thus short-circuiting can be more effectively prevented.

(5) When the distance between a relay terminal pad and a divisional dummy pattern provided near the relay terminal pad is larger than the distance between a wiring and a dummy pattern near the wiring, silver paste on the relay terminal pad will not cause short-circuiting to the dummy pattern near the relay terminal pad even if the silver paste slightly spreads, although conduction is intended to occur generally by the silver paste on the relay terminal pad.

(6) When dummy patterns are provided on the sealing region surrounding the pixel region including that near the terminal pad, the surface level of the interlayer insulation film before polishing in this region is substantially equal to the surface level of the pixel region. The pixel region and its peripheral region are polished at a uniform polishing rate in the planarization process. Thus, the pixel region is more satisfactorily flattened or planarized compared with conventional configurations, resulting in improved reflectance and easy determination of the etching time of the contact hole after polishing.

(7) A dummy pattern, provided at the peripheral portion of the sealing region, has the same surface level as that of the interlayer insulation film lying on the sealing region. The surface of the interlayer insulation film in the sealing region has therefore no slope after polishing, and adhesiveness of the sealing material is improved.

(8) When a dummy pattern in the sealing region is formed on isolated patterns lying on the same layer as the control wiring layer of the switching element, the surface of the interlayer insulation film can be more accurately flattened or planarized by polishing.

(9) When a dummy pattern is formed on a region near the driver circuit which is provided at the periphery of the pixel region and which supplies signals to the switching element, the dummy pattern helps planarization of the interlayer insulation film by polishing.

(10) In the present invention, a dummy pattern is formed at the corner portion of the sealing region surrounding the pixel region and has a lower density than those in the side portion of the sealing region and the peripheral region of the corner portion. As a result, the surface of the unpolished interlayer insulation film has roughness, which reflects a plurality of uneven discrete dummy patterns, at the four-corner sealing portion. Since the four-corner sealing portion has a larger initial polishing rate compared with the gentle bump side in the sealing region in polishing process, the polishing rate is substantially equalized in the inner-sealing region surrounded by the four-corner sealing portion. Accordingly, a variation in residual thickness is suppressed in the pixel region and the sealing region.

(11) Even when the four-corner sealing portion has no dummy pattern (a pattern density of zero), the boundary portion having a higher level than the corner region forms a slanted surface at an initial polishing stage, and the slanted surface spreads towards the inner position.

Consequently, the pixel region and the sealing region can be flattened or planarized as a whole.

(12) In the present invention, a plurality of uneven pseudo pixel patterns imitating the uneven pixels can be formed instead of a wide continuous flat dummy pattern in the non-pixel region. Since the regions other than the pixel region have substantially the same uneven pattern as that of the pixel region, the substrate has a uniform polishing rate from the initial stage, and the surfaces of the pixel region and the sealing region can be flattened or planarized with high accuracy.

(13) When a plurality of uneven pseudo pixel patterns are arranged in the two-dimensional directions on the non-pixel region, the non-pixel region has spatial regularity corresponding to the matrix in the pixel region and thus the flatness over the pixel region and the sealing region is further improved.

(14) When each pseudo pixel pattern includes at least a pseudo gate line and a pseudo data line, the pseudo pixel pattern is very similar to the uneven regularity in the typical uneven pixel portion and the pixel region, and the interlayer insulation film can be flattened or planarized with high accuracy in the pixel region and the sealing region.

What is claimed is:

1. An electro-optical device substrate having a non-pixel region, a pixel region and a sealing region on the periphery of said pixel region, said substrate comprising:

a layered film structure including a plurality of interlayer insulation films and a plurality of conductive layers alternately formed in said pixel region of said substrate, said plurality of conductive layers including a top conductive layer, at least one of said plurality of interlayer insulation films below said top conductive layer being polished; and at least one of said plurality of conductive layers forming a plurality of dummy patterns below said polished interlayer insulation film and in said sealing region.

2. The electro-optical device substrate of claim 1, one of said plurality of conductive layers forming a control wiring layer for a plurality of switching elements and also forming said plurality of dummy patterns.

3. An electro-optical device comprising:

the electro-optical device substrate of claim 1;

a transparent substrate spaced from said electro-optical device substrate; and an electro-optical material positioned between said electro-optical device substrate and said transparent substrate.

4. An electronic display device comprising the electro-optical device of claim 3.

5. A projection display device comprising a light valve using the electro-optical device of claim 3.

6. An electro-optical device substrate having a non-pixel region, a pixel region and a sealing region on the periphery of said pixel region, said sealing region having corner regions and side regions, said substrate comprising:

a layered film structure of a plurality of interlayer insulation films and a plurality of conductive layers alternately formed in said pixel region of said substrate, said plurality of conductive layers including a top conductive layer, at least one of said plurality of interlayer insulation films below said top conductive layer being polished; and at least one of said plurality of conductive layers forming a plurality of dummy patterns below said polished interlayer insulation film and positioned in said corner regions, said plurality of dummy patterns having a lower distribution density in said corner regions than said side regions.

7. The electro-optical device substrate of claim 6, said corner regions having an interior and a periphery, said interior of said corner regions having a lower density distribution than said periphery.

8. The electro-optical device substrate of claim 6, said corner regions comprising upper right and left corner regions and lower right and left corner regions, said lower right and left corner regions having a lower density distribution than said upper right and left corner regions.

9. An electro-optical device comprising:

the electro-optical device substrate of claim 6;

a transparent substrate spaced from said electro-optical device substrate; and an electro-optical material positioned between said electro-optical device substrate and said transparent substrate.

10. An electronic display device comprising the electro-optical device of claim 9.

11. A projection display device comprising a light valve using the electro-optical device of claim 9.

12. An electro-optical device substrate having a non-pixel region, a pixel region and a sealing region on the periphery of said pixel region, said sealing region having corner regions and side regions, said substrate comprising:

a layered film structure of a plurality of interlayer insulation films and a plurality of conductive layers alternately formed in said pixel region of said substrate, said plurality of conductive layers including a top conductive layer, at least one of said plurality of interlayer insulation films below said top conductive layer being polished; and at least one of said plurality of conductive layers forming a plurality of dummy patterns below said polished interlayer insulation film and positioned in said corner regions, said plurality of dummy patterns having at least one vertical dummy pattern at a corresponding vertical side of said corner region and at least one horizontal dummy pattern at a corresponding horizontal side of said corner region.

13. An electro-optical device comprising:

the electro-optical device substrate of claim 12;

a transparent substrate spaced from said electro-optical device substrate; and an electro-optical material positioned between said electro-optical device substrate and said transparent substrate.

14. An electronic display device comprising the electro-optical device of claim 13.

15. A projection display device comprising a light valve using the electro-optical device of claim 13.

16. An electro-optical device substrate having a non-pixel region, a pixel region and a sealing region on the periphery of said pixel region, said sealing region having corner regions, said substrate comprising:

a layered film structure including a plurality of interlayer insulation films and a plurality of conductive layers alternately formed in said pixel region of said substrate, said plurality of conductive layers including a top conductive layer, at least one of said plurality of said interlayer insulation films below said top conductive layer being polished; and at least one of said plurality of conductive layers forming a plurality of dummy patterns below said polished interlayer insulation film and in said sealing region, excluding said corner region.

17. An electro-optical device comprising:

the electro-optical device substrate of claim 16;

a transparent substrate spaced from said electro-optical device substrate; and an electro-optical material positioned between said electro-optical device substrate and said transparent substrate.

18. An electronic display device comprising the electro-optical device of claim 17.

19. A projection display device comprising a light valve using the electro-optical device of claim 17.

20. An electro-optical device substrate having a non-pixel region and pixels in a pixel region, said substrate comprising:

a layered film structure including a plurality of interlayer insulation films and a plurality of conductive layers alternately formed in said pixel region of said substrate, said plurality of conductive layers including a top conductive layer, at least one of said plurality of said interlayer insulation films below said top conductive layer being polished;

a plurality of terminal pads formed in said non-pixel region; and a plurality of switching elements each corresponding to one of said pixels in said pixel region, at least one of said plurality of conductive layers forming a plurality of uneven pseudo pixel patterns positioned in said non-pixel region for eliminating a gap between said pixel region and said non-pixel region.

21. The electro-optical device substrate of claim 20, the plurality of uneven pseudo pixel patterns comprising a two-dimensional array of uneven pseudo pixel patterns.

22. The electro-optical device substrate of claim 20, said plurality of conductive layers further comprising:

a first conductive layer electrically connected to said top conductive layer; and a second conductive layer between said first conductive layer and said top conductive layer, one of said first conductive layer and said second conductive layer including a first dummy pattern of said plurality of uneven pseudo pixel patterns.

23. The electro-optical device substrate of claim 22, the other of said first conductive layer and said second conductive layer including a second dummy pattern of said plurality of uneven pseudo pixel patterns.

24. The electro-optical device substrate of claim 20, each of said plurality of uneven pseudo pixel patterns comprising a pseudo gate line and a pseudo data line.

25. An electro-optical device comprising:

the electro-optical device substrate of claim 20;

a transparent substrate spaced from said electro-optical device substrate; and an electro-optical material positioned between said electro-optical device substrate and said transparent substrate.

26. An electronic display device comprising the electro-optical device of claim 25.

27. A projection display device comprising a light valve using the electro-optical device of claim 25.

* * * * *